US006230307B1

(12) United States Patent
Davis et al.

(10) Patent No.: US 6,230,307 B1
(45) Date of Patent: May 8, 2001

(54) SYSTEM AND METHOD FOR PROGRAMMING THE HARDWARE OF FIELD PROGRAMMABLE GATE ARRAYS (FPGAS) AND RELATED RECONFIGURATION RESOURCES AS IF THEY WERE SOFTWARE BY CREATING HARDWARE OBJECTS

(75) Inventors: Donald J. Davis, Severn; Toby D. Bennett, Adelphi; Jonathan C. Harris, Crofton; Ian D. Miller, Columbia; Stephen G. Edwards, Laurel, all of MD (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/013,186

(22) Filed: Jan. 26, 1998

(51) Int. Cl.[7] ............................. G06F 17/50; G06F 7/38
(52) U.S. Cl. ................................. 716/16; 716/17; 716/7; 716/11; 703/15; 326/37; 326/38; 326/39

(58) Field of Search ................................. 716/17, 16, 8; 703/23

(56) References Cited

U.S. PATENT DOCUMENTS 5,109,353 * 4/1992 Sample et al. ............... 716/17
5,477,475 * 12/1995 Sample et al. ............... 716/16

* cited by examiner

Primary Examiner—Matthew Smith
Assistant Examiner—Jibreel Speight
(74) Attorney, Agent, or Firm—LeRoy D. Maunu; Lois D. Cartier

(57) ABSTRACT

A method and system for programming the hardware of field programmable gate arrays and related reconfigurable resources as if they were software by creating hardware objects that implement application level functionalities, operating system functionalities, and hardware functionalities. Further controlling and executing the hardware objects via high level software constructs and managing the reconfigurable resources, such that the reconfigurable resources are optimized for the tasks currently executing.

55 Claims, 27 Drawing Sheets

| Thread | Hardware Object |
|---|---|
| Begins execution at a predefined location | Begins execution at a predefined state |
| Single-minded, executes linearly from start to end | Single-minded, executes continuously until complete |
| Independent of other threads | Independent of other objects |
| Executed in pseudo-parallel | Executed in parallel |

FIG. 10

Threads vs. Hardware Objects

```
public class HardwareObject extends Thread { public HardwareObject (int[] bitstream);

public load ( );

public unload ( );

public enable ( );

public disable ( );

public start ( );

public stop ( );

}
```

FIG. 11: HardwareObject class

```
// HardwareObject startup sequence public start ( ) {

// Load the bitstream into the RPU load( );

// Start the associated thread

Thread.start ( );

// Enable the object's clock input enable ( );

}
```

FIG. 12: HardwareObject class start access method

```
// HardwareObject shutdown sequence public stop ( ){

// Disable the object's clock input disable( );

// Stop the associated thread

Thread.stop( );

// Free the occupied area of the RPU unload( );

}
```

FIG. 13: HardwareObject class stop access method

Some Typical Atomic Objects

Adder with and without carry in carry lookahead

Counter

Up and down

Comparator

Mux (n to 1)

Multiply/divide

Shift by "n"

Bus split/merge

RAM

Register

Memory

FIG. 14: Illustrative Atomic Objects

```
public class DCT extends AtomicObject
{
        public static String relocHardwareObj = "DCT";

public DCT ( );

public DCT (HardwareObject inputObject,
                OutputPort source,
                InputPort target);

public setinput (int [ ] InputData);

public int [ ] getoutput ( );

public void run ( );

}
```

FIG. 21: Object-oriented language class wrapper for DCT

```
public class Q extends AtomicObject
{
        public static String relocHardwareObj = "Q";

public Q ( );

public Q (HardwareObject inputObject,
                OutputPort source,
                InputPort target);

public setinput (int [ ] InputData);

public int [ ] getoutput ( );

public void run ( );

}
```

FIG. 22: Object-oriented language class wrapper for Q

```
public class VLC extends AtomicObject
{
        public static String relocHardwareObj = "VLC";

public VLC ( );

public VLC (HardwareObject inputObject,
                OutputPort source,
                InputPort target);

public setinput (int [ ] InputData);

public int [ ] getoutput ( );

public void run ( );

}
```

FIG. 23: Object-oriented language class wrapper for VLC

```
int [ ] jpegEncoder (int [ ] SourceImage) {

AtomicObject dct = new DCT ( );

AtomicObject q = new Q (dct);

AtomicObject vlc = new VLC (q);

dct.input (SourceImage);

return vlc.output ( );

}
```

FIG. 24: JPEC Encoder Example code

SYSTEM AND METHOD FOR PROGRAMMING THE HARDWARE OF FIELD PROGRAMMABLE GATE ARRAYS (FPGAS) AND RELATED RECONFIGURATION RESOURCES AS IF THEY WERE SOFTWARE BY CREATING HARDWARE OBJECTS

BACKGROUND OF THE INVENTION

Field of the Invention

The present invention relates generally to dynamically reconfigurable hardware and computing systems and, more particularly to a system and method for developing and executing computing processes using dynamically relocatable hardware objects.

Statement of the Prior Art

Users and developers of computer systems and other processing equipment face three challenges in today's competitive environment: an ever increasing demand for computing power; a need for faster time to market; and a greater demand for operational flexibility.

The development and execution of processing algorithms according to the prior art can be classified under two broad categories of implementation: software and hardware. An algorithm implemented in software utilizes a set of general purpose instructions that provide a high degree of flexibility in implementing a wide variety of processing tasks. However, the processor in such software implementations has a fixed architecture, and the overhead associated with supporting its large number of general purpose instructions decreases overall performance. An algorithm implemented in hardware, on the other hand, such as an application specific integrated circuit (ASIC), is optimized for a single (or a limited number of) processing task(s) and is dedicated to those tasks. Such hardware implementations, however, can provide a higher performance solution but have the disadvantages of lower flexibility and longer time to market.

Traditional software implementations provide many advantages to the developer including reusable processing platforms that can perform many tasks and an iterative design approach. However, these advantages come at the expense of performance. Such traditional software implementations work on an instruction basis which limits throughput. Moreover, they suffer due to their very limited form of parallelism, a lack of dynamic reconfigurability. Microprocessor architectures used with such software implementations are not well suited for efficiently dealing with many applications that require concurrent processing, such as multimedia data and processing network protocols.

Traditional hardware implementations are optimized to provide efficient processing of a single (or a limited number of) algorithm(s). This provides a high level of performance, but since the hardware is fixed, there is limited reuse of the processing platform and the development platform does not allow for iterative development because changes to the hardware are costly and time consuming.

Since the early 1980's, field programmable gate arrays (FPGAs) have been used to provide a partial solution to the limitations encountered in traditional software and hardware implementations. FPGAs are computing devices that can implement virtually any digital circuit in hardware. In addition, many of them can be reconfigured simply by loading them with a different "hardware program." This allows them to implement many processing algorithms with performance that approaches that of dedicated hardware while retaining the flexibility to dynamically reconfigure the implementation when necessary. This hybrid technology of reprogrammable hardware can provide many of the advantages of both hardware and software. Illustrative of such reconfigurable hardware according to the prior art are the methods and apparatus for emulating a circuit design disclosed in U.S. Pat. Nos. 5,109,353 and 5,477,475.

The system and methods according to such prior art are suitable for physical emulation of electronic circuits or systems and use programmable gate arrays including a network of internal probing interconnections of unused circuit paths in the programmable gate arrays.

However, FPGAs alone have several disadvantages which have kept them from enjoying the widespread application to general purpose computing that is their potential. It is only recently that FPGAs have contained enough logic gates to implement complex algorithms. In addition, FPGAs that boast fast runtime reconfiguration, partial reconfiguration, on-the-fly reprogrammability, and the ability to read the internal state of the device (features that are essential to dynamically reconfigurable computing applications), are just moving to full production. The advent of FPGAs which are optimized for reconfigurable computing provides the foundation for reconfigurable applications.

The use of reconfigurable hardware with appropriate development tools and runtime environments to create reconfigurable computing processes will address the performance issues of software approaches while providing the flexibility missing from hardware approaches. The actual processing algorithms are implemented in hardware and have performance commensurate with this approach. Time to market is reduced by allowing an iterative design approach previously unavailable to hardware designers. This gives rise to an ability to update the system in the field which helps to hold off obsolescence. New functionality can thus be implemented in already deployed equipment.

The prior art, however, does not fully realize this potential. Performance for many applications is excellent but the development process is more akin to ASIC development than software development. Furthermore, in current implementations, the reconfigurable hardware is fixed after the development and debug phases in terms of product life cycle, ignoring dynamic field reprogrammability, which is one of the primary advantages of reconfigurable hardware. Finally, current implementations do not take advantage of the parallelism (i.e., the ability to temporally share the hardware resources) to optimize the processing hardware for the tasks at hand.

What is necessary is a method to dynamically change the hardware implementation during execution based on processing requirements. This will provide performance approaching that of custom hardware solutions with the flexibility to adapt to real-time requirements. In addition, the development of the hardware implementations should be provided using traditional software design methodologies to allow a rapid iterative development approach.

SUMMARY OF THE INVENTION

The present invention describes a computing system that dynamically configures itself during execution based on real-time processing requirements. This includes but is not limited to its hardware implementation The present invention further comprises a system and method for developing and executing processing tasks using dynamically relocatable hardware objects. Development of the algorithms for these processing tasks is accomplished using a combination of location independent hardware objects to build complex functions. This effort is limited by the configuration or framework which enforces certain limitations with respect to standard methods of accessing relocatable resources and standard structure size and shape. Object execution occurs in an environment that provides scheduling, object instantiation, object swapping, object management, and data movement services in modular layers.

The present invention is primarily concerned with two aspects of reconfigurable computing. The first is the development environment and the second is the runtime environment. These two aspects are tightly coupled in the sense that the runtime environment of the present invention expects to execute programs generated by the development environment of the present invention, while the development environment of the present invention assumes the existence of and will utilize the services of the runtime environment of the present invention.

It is an object of this invention to generate relocatable hardware objects which can be moved at runtime to different locations within the reconfigurable resource. In addition, due to efficiency considerations, the lower level components that comprise hardware objects are relationally placed and intra-object routed during design of the hardware object.

It is a further object of this invention to define a standard method of accessing reconfigurable processing units (RPUs) on the physical hardware and to define a standard structure for relocatable hardware objects. This will make the hardware objects "plug compatible" or "plug and play" by using standard structures and interfaces.

It is a still further object of this invention to control and manage RPUs by providing scheduling, object instantiation, object swapping, object management, and data movement services in modular layers necessary for multiple tasks, multiple hardware objects, and/or multiple users common in concurrent platforms.

It is a still further object of this invention to define a method for the development of reconfigurable computing processes using hardware objects.

These and other objects according to the present invention will become more apparent from the following detailed description thereof, when considered in conjunction with the drawings wherein:

BRIEF DESCRIPTION OF THE DRAWINGS

FIG. 10 compares the characteristics of traditional software threads with the characteristics of hardware objects;

FIG. 11 depicts standard access methods for a hardware object;

FIG. 12 details the start access method shown in FIG. 11;

FIG. 13 details the stop access method shown in FIG. 11;

FIG. 14 illustrates several atomic objects;

FIG. 21 details the class wrapper for the discrete cosine transform (DCT) atomic object shown in FIG. 20;

FIG. 22 details the class wrapper for the quantizer (Q) atomic object shown in FIG. 20;

FIG. 23 details the class wrapper for the variable length coder (VLC) atomic object shown in FIG. 20;

FIG. 24 depicts the source code for the JPEG encoder shown in FIG. 20;

DETAILED DESCRIPTION OF THE INVENTION

The present invention discloses a method and a system for dynamically relocatable hardware object development and execution which, in some respects, resembles software system development. In particular, the present invention specifies the design and execution of hardware objects in a manner similar to the development of software subroutines. However, development and execution of relocatable hardware objects offers several advantages over traditional hardware and traditional software implementations.

Figure 1:
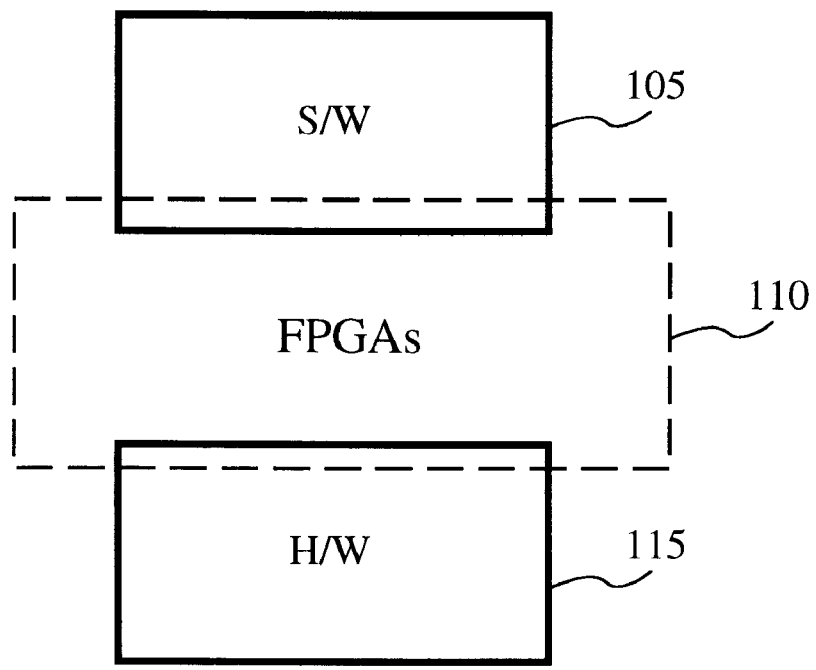
FIG. 1 depicts how the characteristics of field programmable gate arrays (FPGAs) overlap both hardware and software.

FIG. 1 depicts the respective positions of software, hardware, and FPGAs. Software generally provides a flexible implementation that can be easily changed to add new features or conform to new requirements. Hardware implementations can provide extremely high performance because they can be tuned to a specific application. FPGAs have the potential to bridge this gap between flexibility and high performance.

In software development, there are several widely known and widely followed software development methodologies, along with well known constructs and languages for both design and development phases. For example, software languages include everything from assembly to C and C++ to Java. Hardware also has design methods including schematic capture and hardware description languages (HDLs) like Verilog or VHDL (VHSIC [Very High Speed Integrated Circuit] Hardware Description Language). However, these HDLs are more akin to software assembly than to C. In an HDL, the level of abstraction remains very close to the physical device. This closely parallels most assembly languages, which provide a level of operation very close to the processor (such as instructions to access registers within the processor and even to access and modify individual bits within the processor). In contrast, the prior art contains no hardware analog to the object-oriented software approach of such languages as C++. A system according to the present invention provides such a system for the development (and execution) of reconfigurable hardware resources.

The hardware is ultimately built in silicon. Software cannot perform any work by itself. It must run on hardware. FPGAs have historically been used as replacements for traditional ASICs, so the design processes have utilized ASIC design processes. The present invention provides a system for developing reconfigurable computing applications that utilizes higher level software constructs. Reconfigurable computing technology (RCT) is a new paradigm for processing that delivers the speed of hardware with the flexibility of software.

A. Reconfigurable Computing Technology

Figure 2:
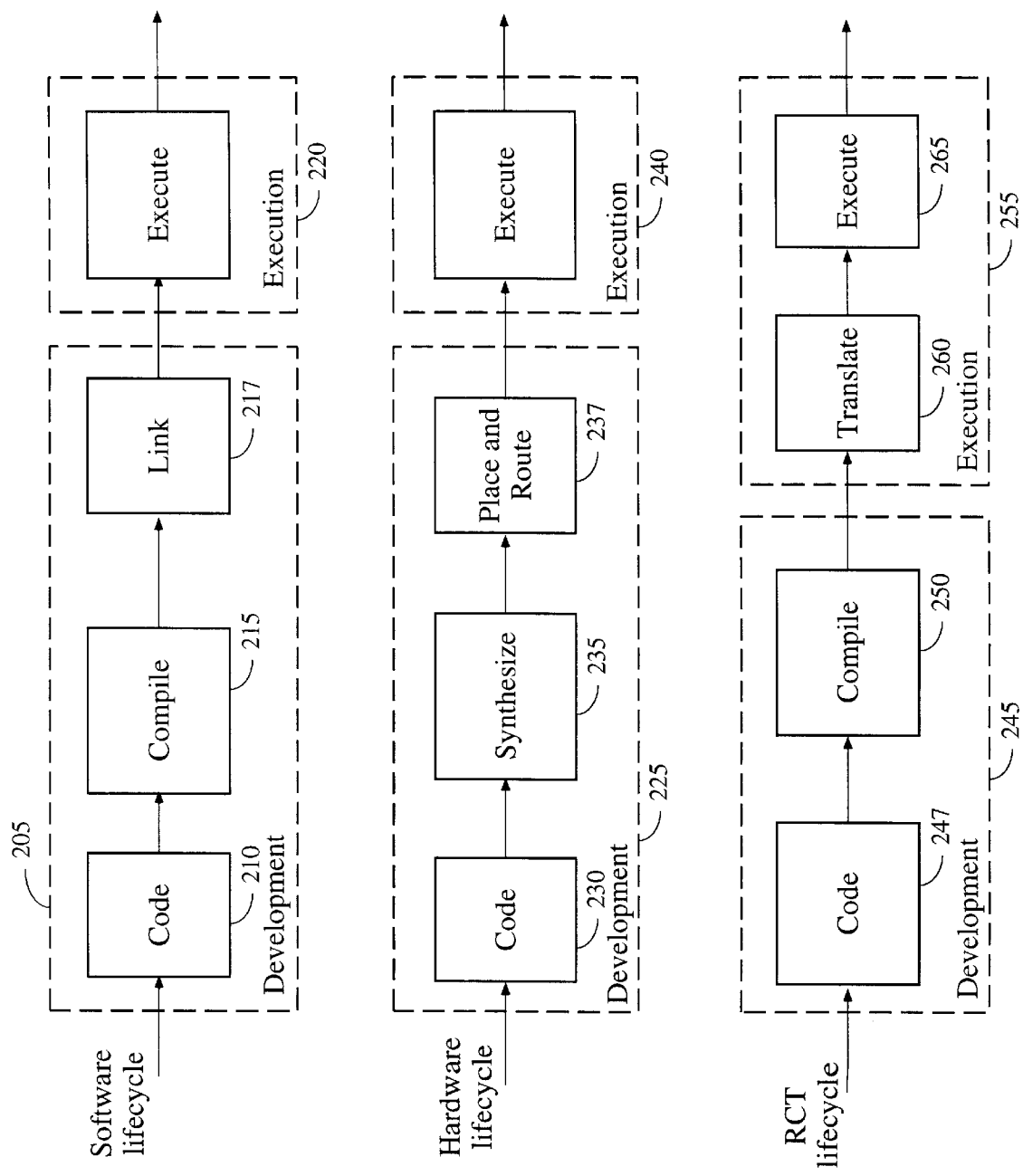
FIGS. 2 depicts the development and execution environments for software, hardware, and reconfigurable computing technology (RCT)

FIG. 2 contrasts the development and execution environments for software, hardware, and RCT. Each technology involves four fundamental steps: generation of source code, conversion of the source code modules, combination of the converted source code modules, and execution of the converted and combined source code.

The software development process 205 comprises generation of the source code 210, followed by compilation 215 (i.e. conversion) and linking 217 (i.e. combination). Once it has been compiled and linked, software execution 220 occurs. Similarly, hardware development 225 (using an HDL) consists of source code generation 230, followed by synthesis 235 (i.e. conversion) and placement and routing 237 (i.e. combination). Once converted to hardware form, execution 240 of the resulting fixed hardware occurs.

The differences in the development and execution of RCT provide several distinct advantages over traditional software and hardware approaches. RCT development 245 comprises coding 247 at a high level of abstraction (similar to object oriented software methodologies, and unlike using a HDL), followed by compilation 250. The execution phase 255 when using RCT involves both translation 260 and execution 265. This approach allows dynamic use of hardware processing elements based on the processing requirements, unlike the fixed nature of traditional hardware solutions. A system according to the present invention, therefore, enjoys both the flexibility of software and the performance of hardware.

Figure 3:
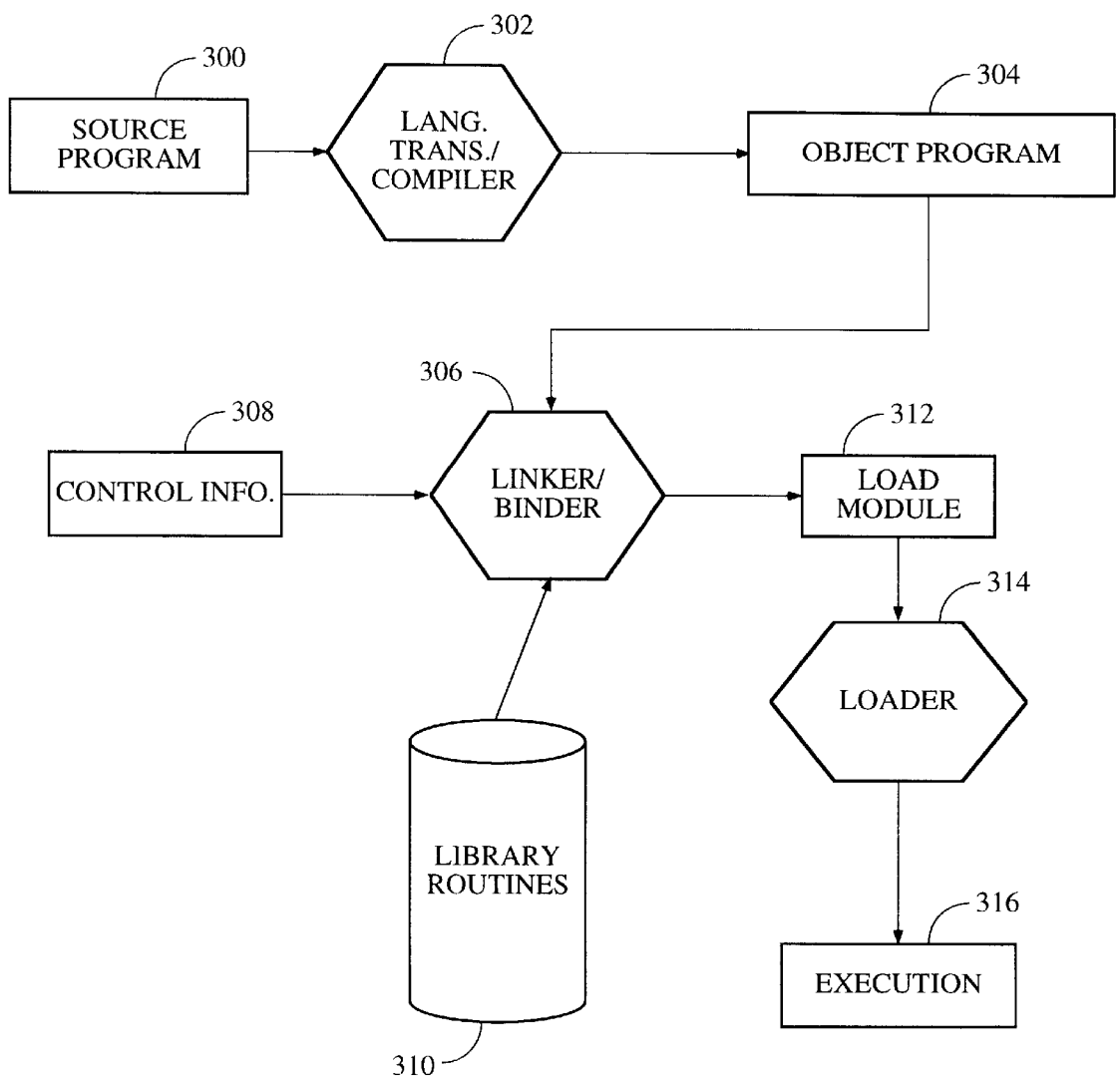
FIG. 3 illustrates the traditional software development process.

FIG. 3 further illustrates the process of software development, which consists of the steps of: writing a program (source program 300); using compiler or translator 302 to convert it into object program 304; running object program 304 through linker or a binder 306 to incorporate any control information 308 as well as resolve all references, (e.g. calls to library routines 310), resulting in load module 312 as output; running load module 312 through loader 314 to actually get the executable code into a computer system; and executing program 316.

Figure 4:
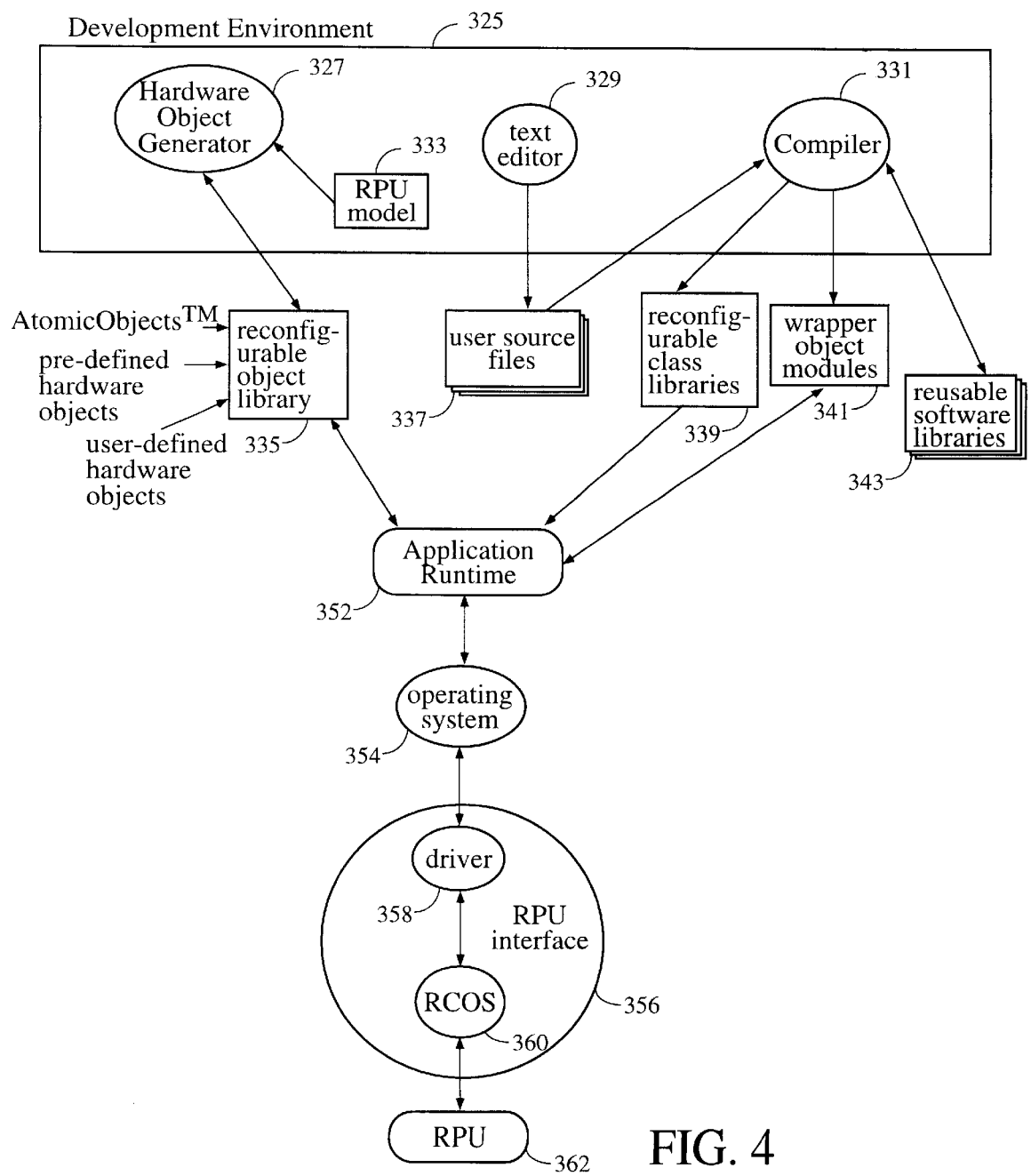
FIG. 4 illustrates the development process for RCT.

In contrast to the software development cycle shown in FIG. 3, FIG. 4 depicts software development and execution in an environment which has been modified to account for and include the present reconfigurable computing runtime environment. While Java represents the preferred embodiment, any programming language with the necessary syntax and constructs described herein could be used in alternative embodiments of the present invention.

As shown in FIG. 4, the present invention comprises a development environment 325 and a runtime environment 350. Development environment 325 comprises those elements required for designing systems utilizing RCT. Runtime environment 350 comprises the elements needed to execute RCT systems. Tight coupling exists between development environment 325 and runtime environment 350 since runtime environment 350 expects to execute programs generated by development environment 325 and development environment 325 assumes the existence of and will utilize the services of runtime environment 350.

Development environment 325 comprises hardware object generator 327, text editor 329, and compiler 331. Hardware object generator 327 utilizes data from RPU model 333, and retrieves and stores reconfigurable objects from and to reconfigurable object library 335. Text editor 329 is used to generate user source files 337, which are compiled with data from reconfigurable class libraries 339 and reusable software libraries 343 by compiler 331 to generate wrapper object modules 341.

Runtime environment 350 comprises application runtime 352, operating system 354, RPU interface 356, and RPU 362. In the preferred embodiment of the present invention, RPU interface 356 comprises driver 358 and reconfigurable operating system ("RCOS") 360. Application runtime 352 receives information from reconfigurable object library 335, reconfigurable class libraries 339, and wrapper object modules 341. Application runtime 352 exchanges information with operating system 354, which exchanges information with RPU interface 356. RPU interface 356 communicates directly with RPU 362.

FIG. 4 depicts the system of the present invention including both the development environment and the runtime environment. Also depicted in FIG. 4 is a generalized embodiment of the invention showing a single RPU 362. While the preferred embodiment is as described, there is no reason why an alternate embodiment could not be a plurality of RPUs. Either of these embodiments may or may not have an embedded processor or a plurality of embedded processors. Additionally, the RCOS may run on an embedded processor, a reconfigurable processor, a plurality of processors of either type, or partially on both types of processors or a plurality thereof.

Figure 5:
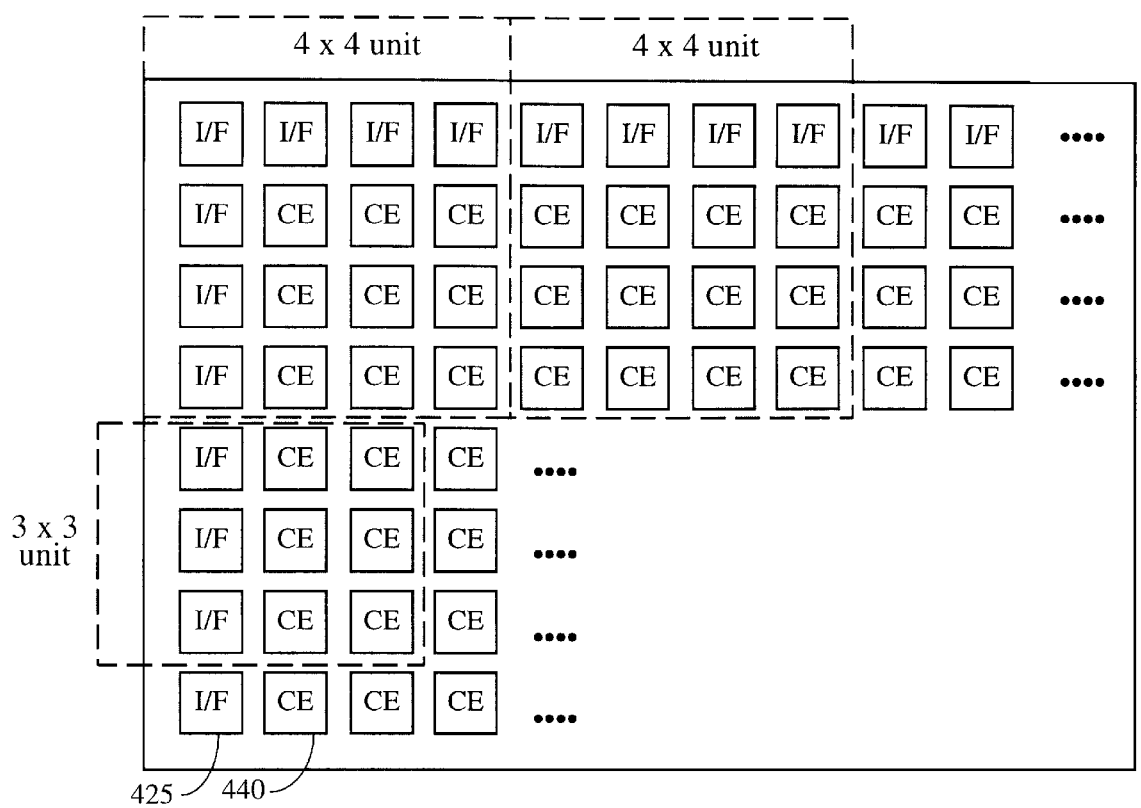
FIG. 5 depicts a reconfigurable processing unit (RPU)

An RPU, as shown in FIG. 5, comprises a plurality of logic elements. There are two types of logic elements— computational elements and interface elements. Computational elements 440 are logic elements that do not interface directly to hardware outside of the RPU. Interface elements 425 are logic elements that do interface to hardware outside of the RPU, and therefore can receive input from the sources external to the RPU and provide output (results) to external to the RPU.

Figure 6:
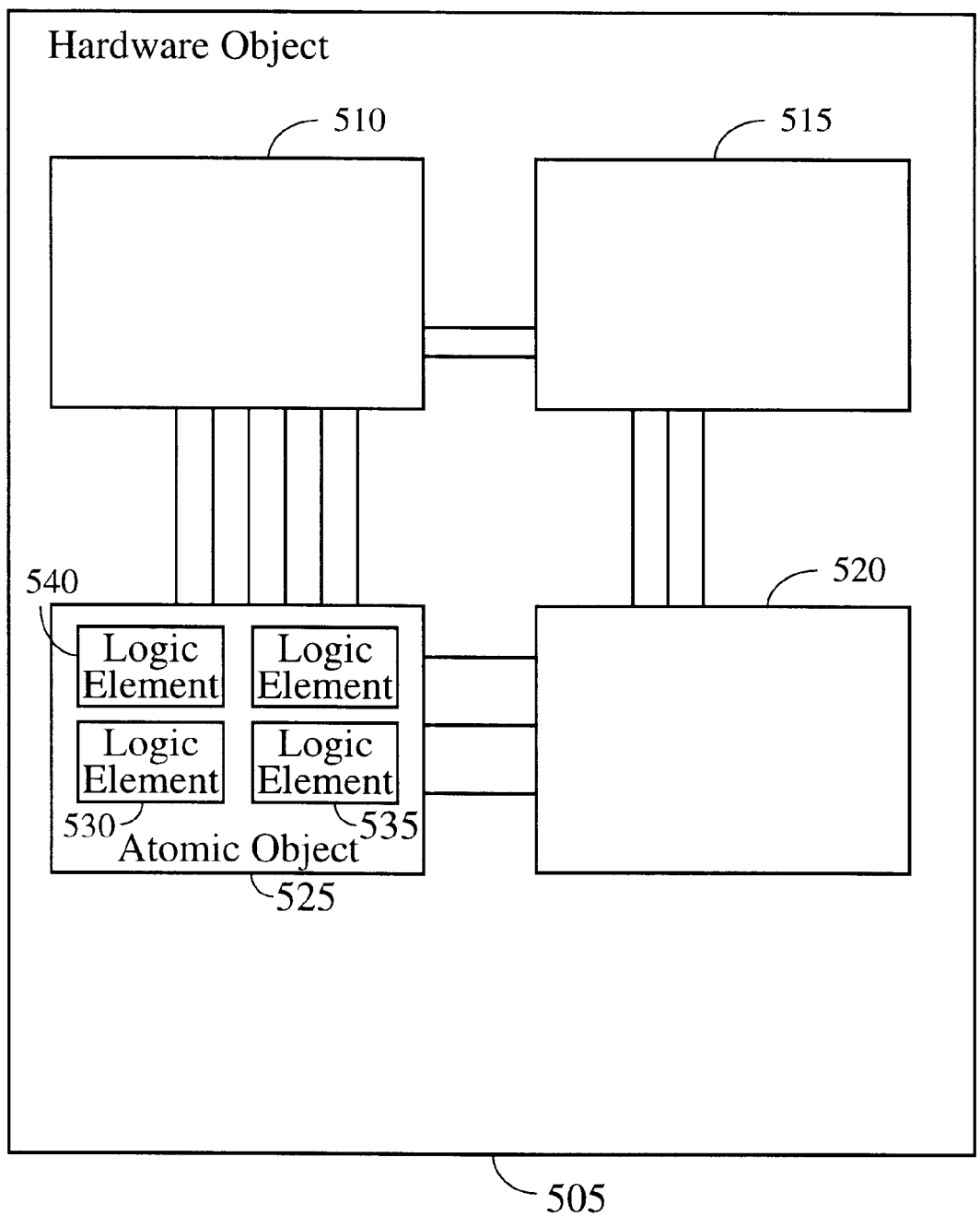
FIG. 6 depicts the embedded nature of the logical structures within a RPU.

FIG. 6 depicts the embedded nature of the components of a RPU. Generic logic elements in FIG. 6 include 530, 535, and 540. An Atomic Object™, as depicted in FIG. 6 by 510, 515, 520, and 525, is a self-contained functional hardware unit, comprised of logic elements, that cannot be decomposed but that can be implemented in an RPU. Atomic Object™s are used as base building blocks for the design of more complex circuit functions. Hardware objects are generally comprised of one or more Atomic Object™s. Hardware objects perform discrete functions and contain their own state and configuration information. Hardware object 505 depicted in FIG. 6 comprises Atomic Object™s 510, 515, 520, and 525.

Due to efficiency considerations, Atomic Object™s are relationally placed and intra-object routed as hardware objects are designed or built from Atomic Object™s. Additional hardware objects can be designed or built by extending hardware objects that have already been built, combining objects (either Atomic Object™s or hardware objects or both), or creating an entirely new hardware object from Atomic Object™s. A key feature of hardware objects is that they are relocatable; they can be moved to different RPUs on a board or to different areas or sections within a given RPU by the runtime environment based on real-time requirements.

The framework abstraction defines and controls standard methods for accessing reconfigurable resources, and for defining and controlling a standard size and shape for a relocatable hardware object.

In order for hardware objects to cooperate, or even to coexist, in what are essentially ad hoc networks within the RPU, the present invention imposes a structure on the design and placement of these components. A system according to the present invention establishes rules governing the interfaces of the hardware objects. This allows hardware objects to be "plug compatible" such that two hardware objects having no a priori knowledge of each other but performing complimentary functions can be connected together to exchange data. The size and orientation of hardware objects must also be constrained to maximize the efficient use of RPUs by collections of hardware objects which have been separately designed.

The above described restrictions on hardware objects allow a system according to the present invention to manage the tradeoff between the utilization of the RPU and the overhead associated with the placement and routing of the objects in real-time. Dividing the RPU into a discrete set of hardware pages greatly reduces the complexity of the decision tree for the runtime environment while still achieving good overall utilization of the part. A system according to the present invention provides a standard framework to support the hardware objects and their associated interfaces, which reduces further the overhead associated with the runtime environment. This framework provides an interface to the memory resources and processor bus that are always resident. In addition, it defines and provides a standard socket to plug-in the hardware objects that takes care of interfacing the objects to the data source and data sink.

In defining and controlling standard methods for accessing the reconfigurable hardware resources, the present invention requires that all interface elements are on the outer or external edges of the RPU. That is, a coarsely mapped unit that is in a corner of the RPU chip is by definition more I/O intensive because two edges have interface elements. In contrast, side and top/bottom units are more compute intensive being comprised of more computational logic elements. The actual method of accessing these reconfigurable resources is defined and controlled by the object-oriented class wrapper software.

Furthermore, in defining and controlling a standard structure, a system according to the present invention sets the size and shape of a coarsely mapped unit. For example, the smallest size is a 1×1 and the largest is m×m where this is the entire FPGA. An a×b coarsely mapped unit is a unit larger than a 1×1 it and smaller than a m×m unit. The size is driven by the total number of logic elements available, I/O versus computational considerations, and considerations relating to the number of unused versus used logic elements for a given size unit. Currently, the shape of a unit in the preferred embodiment is square but it need not be. The size of a unit is further not fixed, that is, it can be changed depending on the functions or mix of functions to be implemented. In other words, while 4×4s and 3×3s are depicted in FIG. 5, the present invention could be implemented using 16×16s which would provide more logic elements per hardware object but may have a higher ratio of unused to used logic elements in the unit depending on the complexity of the functions being implemented. The process of defining a coarse mapping determines the standard structure of the preferred embodiment.

Hardware objects developed from Atomic Object™s require one or more of these "coarsely mapped" standard structures. The developed hardware objects are fit into the standard structures as defined above and each such process uses standard (I/O) access methods.

Figure 7:
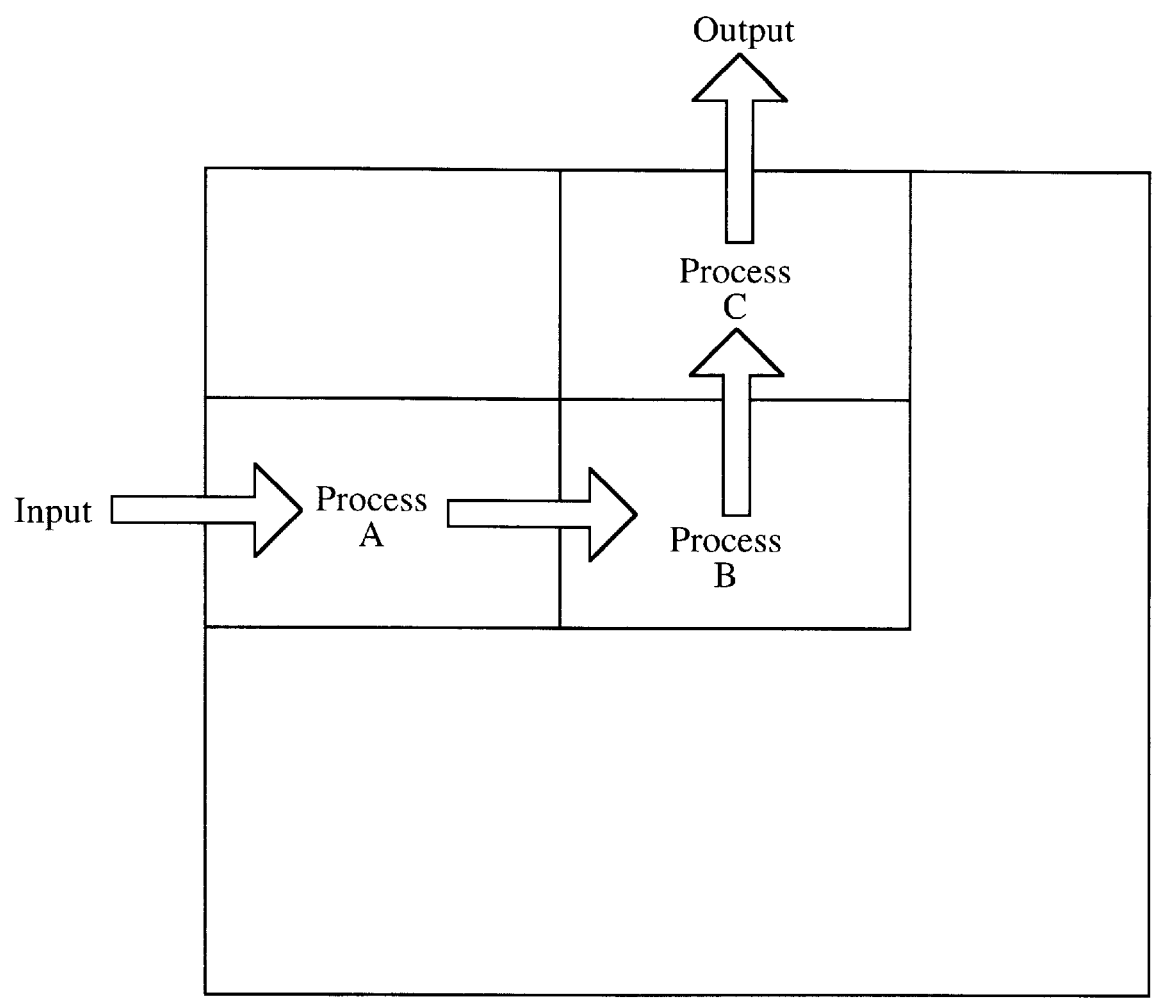
FIG. 7 depicts three processes executing within one RPU.
Figure 8:
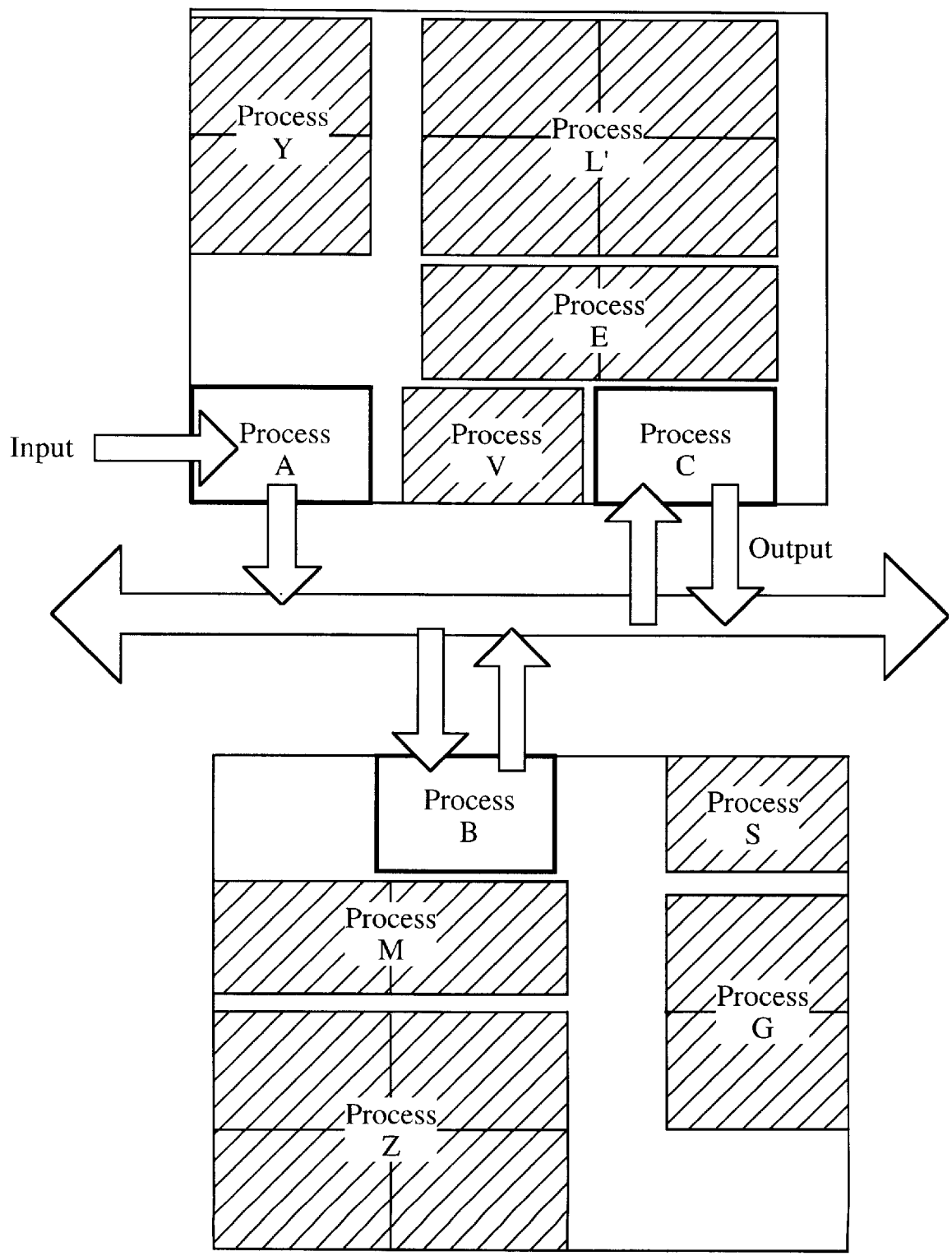
FIG. 8 depicts the same three processes shown in FIG. 7, but with their execution distributed across two RPUs.

FIG. 7 depicts an example of processes A, B, and C, where process A receives input from the sources external to the RPU. Process B receives its input from the output of process A, and process C receives its input from the output of process B. Finally, process C returns its output to a sink external to the RPU. FIG. 8 depicts the same set of processes but with the three processes distributed across two RPUs along with other processes that are running concurrently.

The purpose of the coarse mapping is to select one or a small number of standard sizes to make the placement decision tree easier to implement and more efficient, and to as fully as possible use available logic elements on the standard structure. This means at runtime, the place and route algorithm or decision tree need not deal with individual programmable gates but rather deals with the placement and routing of larger coarsely mapped standard units in a block. Use of coarsely mapped standard units occurs at the expense of some unused logic units in a standard structure. This is true even if the processes are distributed across a plurality of RPUs as illustrated in FIG. 8.

B. Development Environment

Figure 9:
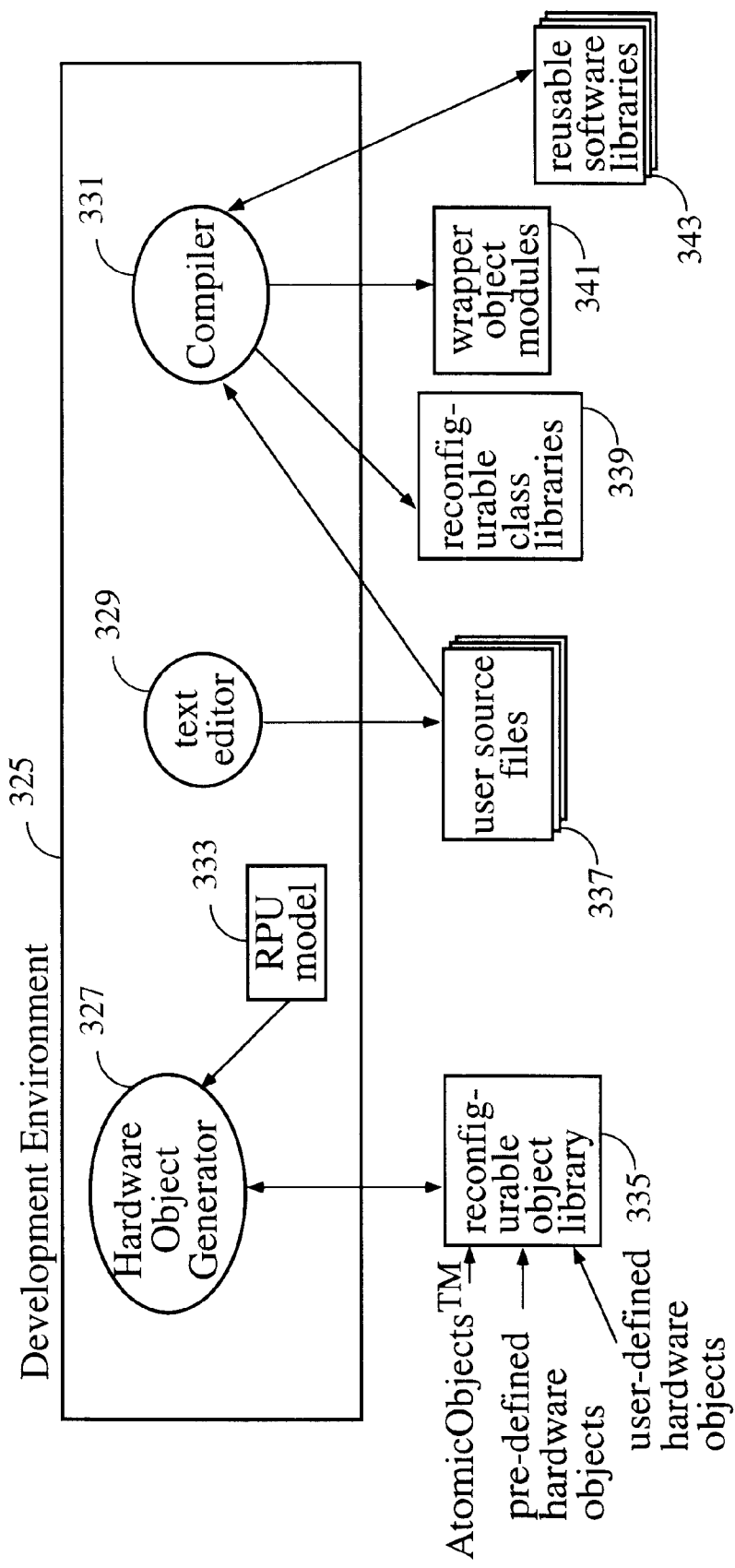
FIG. 9 depicts the development environment of the present invention.

Referring to FIG. 9, development environment 325 of the present invention comprises all aspects of programming hardware as if it is software. It utilizes libraries of functional hardware objects that are connected together using high level software language constructs to provide complex functionality.

Development environment 325 comprises hardware object generator 327, text editor 329, and compiler 331. Hardware object generator 327 utilizes data from RPU model 333, and retrieves and stores reconfigurable objects from and to reconfigurable object library 335. Text editor 329 is used to generate user source files 337, which are compiled with data from reconfigurable class libraries 339 and reusable software libraries 343 by compiler 331 to generate wrapper object modules 341.

Reconfigurable object library 335 comprises Atomic Objects™, pre-defined hardware objects, and user-defined hardware objects. This library contains the objects (both Atomic Objects™ and hardware objects) necessary for building other hardware objects. Any newly developed hardware objects are relationally placed and internally routed according to the constraints of the target RPU as described by RPU model 333.

A software wrapper is generated for the hardware object using an appropriate programming language. The wrapper software is written using text editor 329 and saved in user source files 337 on the host processor. Compiler 331 then generates wrapper object modules from user source files 337 and reusable software libraries 343. These modules are then statically or dynamically linked, depending upon the software runtime environment, with the pre-existing reconfigurable class libraries 339 that implement the generic application functionality for communicating with the RCOS.

A hardware object in the present invention has many similarities to an object used in an object-oriented programming language (i.e., a software object). However, hardware objects are different than software objects in several fundamental ways; they expect to be run in parallel with other hardware objects and require a software language that can control them in this manner. Thus, any software application that could be written as a sequence of microprocessor (or processor) instructions could then be rewritten in whole or in part as a configuration of hardware objects. Equally important and fundamental is the concept of reconfigurability based on real-time processing requirements.

From a software perspective, the closest analogy to a hardware object is a thread in a multitasking operating system. FIG. 10 compares the characteristics of threads and hardware objects. Threads and hardware objects both have a known initial state. For a thread, that state is an instruction pointer initialization. For a hardware object, it is the state of all of the registers and memory elements inside of the design.

Threads and hardware objects both execute continuously until they complete. A thread executes linearly from start to end while a hardware object accepts inputs and processes them until a result is produced. Threads and hardware objects are independent entities. They perform their tasks independently of other threads or objects. If it is desirable to have several threads or hardware objects communicate with one another, that activity must be specified and coordinated. Finally, both threads and objects are executed in parallel. For a thread, it is actually pseudo-parallel in that a processor can generally only execute one or a limited number of instructions at a time. Hardware objects are executed in parallel up to the available resources in the RPU.

The parent object oriented language class to capture this functionality is denoted Hardware Object, as shown in FIG. 11 on line 1. It inherits and extends the object-oriented language's built-in thread class. There are two main reasons for this. The first is because of the similarities between a thread and a hardware object. The second is because it is important to provide every hardware object with an associated software thread with which it communicates and which controls it. In the current embodiment of this invention, Java has been chosen as the object oriented language. Other object oriented languages such as C++, Ada, or Smalltalk could be used, as well as any other such languages developed in the future. Other non-object oriented languages which support communication with the RCOS could also be used.

FIG. 11 depicts six standard access methods provided for the Hardware Object class. The first two, public load( ) on line 3 of FIG. 11 and public unload( ) on line 4 of FIG. 11, are for positioning and removing relocatable hardware objects onto and from the RPU. The second two, public enable( ) on line 5 of FIG. 11 and public disable( ) on line 6 of FIG. 11, are for controlling the clock input to the hardware object. Controlling the clock controls when the hardware object is running since all hardware objects need to be clocked in order to process data. The final two access methods, public start( ) on line 7 of FIG. 11 and public stop( ) on line 8 of FIG. 11, are used to invoke and halt the hardware object. These methods override Thread.start and Thread.stop to provide knowledge about hardware objects.

For the start access method, shown in FIG. 12, three things need to be done. First the relocatable hardware object must be loaded into the RPU as denoted on line 4 of FIG. 12. This is done by making a call to the runtime environment and the runtime environment will either load the relocatable hardware object or place the request in the queue. Next, the software thread that is responsible for communicating with the hardware object is started as denoted on line 6 of FIG. 12. Finally, the hardware object's clock is enabled as denoted on line 8 of FIG. 12.

The stop access method, shown in FIG. 13, is simply the start access method in reverse. First the clock input is disabled as denoted on line 4 of FIG. 13, then the software thread is stopped as denoted on line 6 of FIG. 13 and finally the relocatable hardware object is unloaded as denoted on line 8 of FIG. 13.

When designing a hardware object, both a relocatable hardware object and a class wrapper for the relocatable hardware object must be generated. The wrapper is a class that inherits from and extends Hardware Object. Within the new object's class, a reference to the relocatable hardware object, a run access method, and a mechanism to assign the inputs and outputs must be provided. The run access method contains the code for the software thread associated with the hardware object. (If the designer does not want to provide a software thread associated with the hardware object for some reason, then the run method may be omitted.) Mechanisms assigning inputs and outputs can be done either in the constructors or through special access method calls or both.

If hardware objects do not already exist to accomplish the task contemplated, they must be developed by extending current objects, combining objects, or developing an entirely new object. Traditional hardware design methodologies can of course be used to create hardware objects. This involves using either schematic capture or an HDL to capture the functionality and then synthesis and place and route to actually implement the design for a give hardware architecture. FIG. 14 illustrates several Atomic Objects™ that can be used as base building blocks.

C. Execution/Runtime Environment

Figure 15:
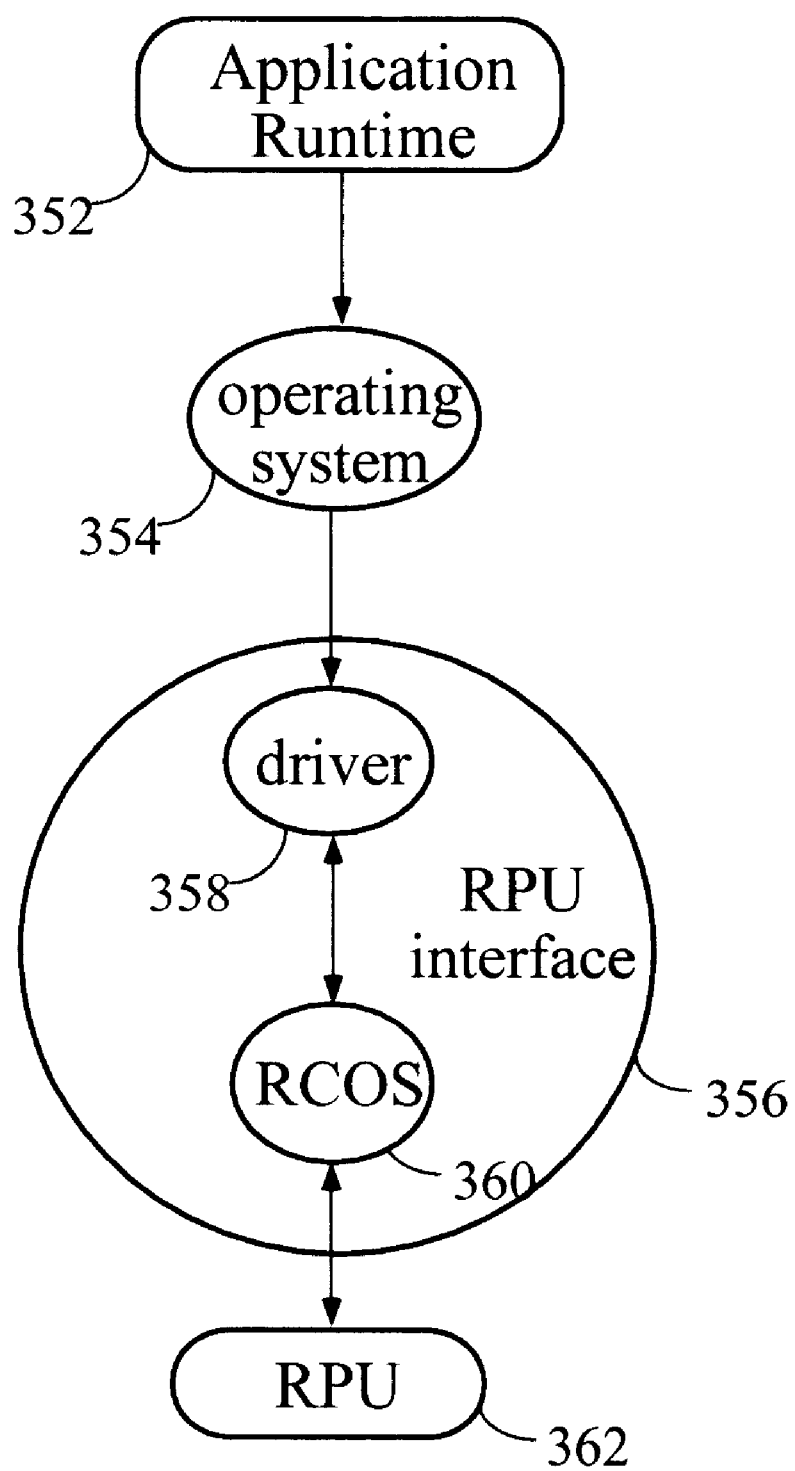
FIG. 15 depicts the runtime environment of the present invention.

FIG. 15 depicts runtime environment 350, which comprises application runtime 352, operating system 354, RPU interface 356, and RPU 362. In the preferred embodiment of the present invention, RPU interface 356 comprises driver 358 and reconfigurable operating system (RCOS) 360. Application runtime 352 receives information from reconfigurable object library 335, reconfigurable class libraries 339, and wrapper object modules 341. Application runtime 52 exchanges information with operating system 354, which exchanges information with RPU interface 356. RPU interface 356 communicates directly with RPU 362.

The runtime environment shown in FIG. 15 of the present invention dynamically configures and executes hardware objects based on real-time processing requirements. This represents a significant advance in the state of the art of runtime environments for reconfigurable hardware resources. The runtime environment of the present invention provides a standard method for interfacing to a RPU. The design of the runtime environment of the present invention is modular and layered. Layering allows appropriate abstractions to be implemented and assists in the modularity of the runtime environment. In addition, the modular nature of the runtime environment allows individual pieces of functionality to be changed and improved as new technologies and ideas emerge. In addition, support for different hardware architectures and devices is easily achieved by implementing the appropriate modules and inserting them into the appropriate runtime environment layer.

Application runtime 352 provides an environment in which the application executes. The characteristics of application runtime 352 are particular to a given programming language and operating system. The C language, for example, provides only a very primitive runtime capability, consisting of library functions and operating system calls. Conversely, Java has an extensive runtime system that allows an application to query its own attributes, load additional modules, and even modify itself during execution. Application runtime 352 executes the user application by loading and executing the appropriate modules. At the direction of the program modules, application runtime 352 communicates directly through host operating system 354 with RPU interface 356, which comprises reconfigurable processor driver 358 and RCOS 360. RCOS 360 provides functionality to application runtime 352 for loading, controlling, and communicating with hardware object instances in RPU 362.

Figure 16:
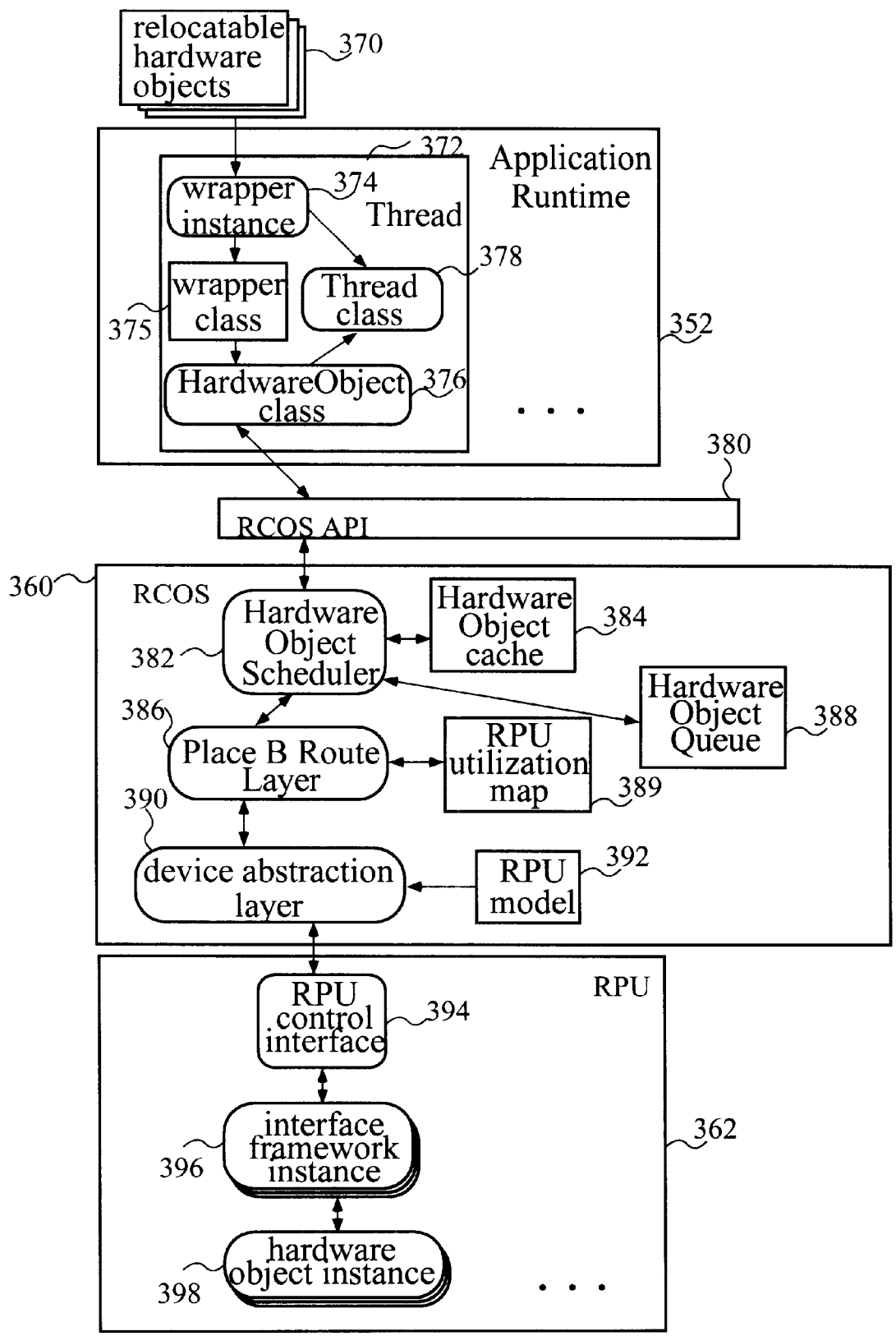
FIG. 16 further details the runtime environment of the present invention.

FIG. 16 depicts the software elements that execute in the various runtimes. The runtime environment of the present invention is accessed via the RCOS API 380, which is a high level API, that provides these functions to the application while encapsulating and hiding their implementation. When a call is made to provide a specific function in reconfigurable resources, a message is passed to the runtime that includes information about the function, data to process, where to put the results and what the priority of the function is. At that point, the application is free to perform other tasks. Note that these messages may be generated by a number of threads in either the same program or multiple other programs.

The runtime environment for reconfigurable computing is leveraged by the application developer and used by the end application. It allows a developer to easily develop applications that can take advantage of any reconfigurable resources available without having to worry about the size of the resources or their temporal availability. In addition, it allows the use of reconfigurable resources in a multi-threaded multi-user environment by managing the resource allocation among multiple threads and programs.

Application runtime 352 instantiates the various software object instances that comprise a user application. For each relocatable hardware object 370 in the application, there will be a corresponding wrapper instance 374 of the user's Hardware Object class 375. The user's Hardware Object class 375 is defined as a subclass of the pre-defined class Hardware Object. Wrapper instance 374 may invoke the functionality of the user's Hardware Object class 376, as well as the functionality of Thread class 378, of which Hardware Object is a subclass. Each wrapper instance 374 runs it own thread of execution 372. It references its corresponding relocatable hardware object 370 from the library of hardware objects and submits it to RCOS 360 when the object is loaded.

Wrapper instance 374 uses the methods provided by the Hardware Object class 376 to interact with RCOS 360. The functionality provided by RCOS 360 to the objects in the application runtime 352 comprises RCOS API 380. RCOS API 380 is defined as an implementation-independent interface. By adhering to this API, an application may be reused across multiple RPUs.

RCOS 360 instantiates the software object instances which implement the RCOS API 380. These include hardware object scheduler 382, place and route layer 386, and device abstraction 390.

Hardware object scheduler 382 fields requests made through RCOS API 380 by the application. These requests include those for loading, unloading, and control of hardware object instances 398. When relocatable hardware objects are placed and routed, an image of the resulting relocatable hardware object 370 and its associated state is maintained in hardware object cache 384 so that relocatable hardware object 370 can be reused at a later time if the object is swapped out and then replaced. Hardware object scheduler 382 also maintains hardware object queue 388 of those relocatable hardware objects that are waiting to execute. Hardware object scheduler 382 periodically applies an algorithm to determine which of these objects should be placed into RPU 362 and which should be swapped out and placed back in the hardware object queue 388.

Figure 17:
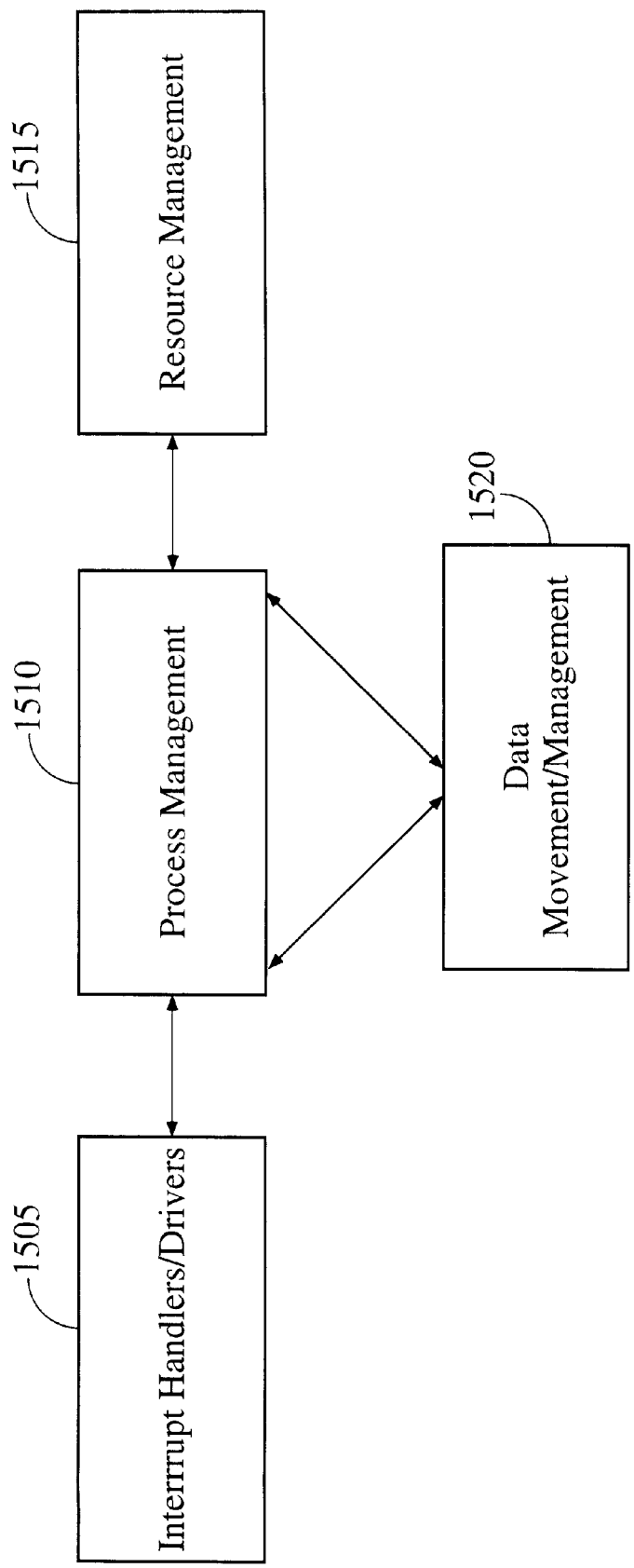
FIG. 17 depicts the structure of a traditional software operating system.

FIG. 17 depicts a standard operating system. Process Management 1510 encompasses functions such as creation, removal, communication, control, scheduling/dispatching of processes/tasks. In a standard operating system scheduling might have been performed on a round robin, exponential, logarithmic, or time share basis as examples. Primitives might include: create, delete/destroy, change priority, wakeup/activate, suspend/sleep. Status information might include: running, ready, blocked.

Resource Management 1515 administrates and allocates such key resources as storage space. Resource Management 1515 handles resource allocation as well as resource deadlocks. Primitives might include: request, allocate, free/release.

Data Movement/Management 1520 encompasses creating, destroying, modifying, and retrieving information on I/O access and control. Primitives might include: read and write (i.e. I/O control), or test and set (i.e. I/O status).

Accounting is typically a function of a standard operating system. In this case accounting refers not to billing for services but to system performance statistics to be used as feedback for upgrades to the design.

Figure 18:
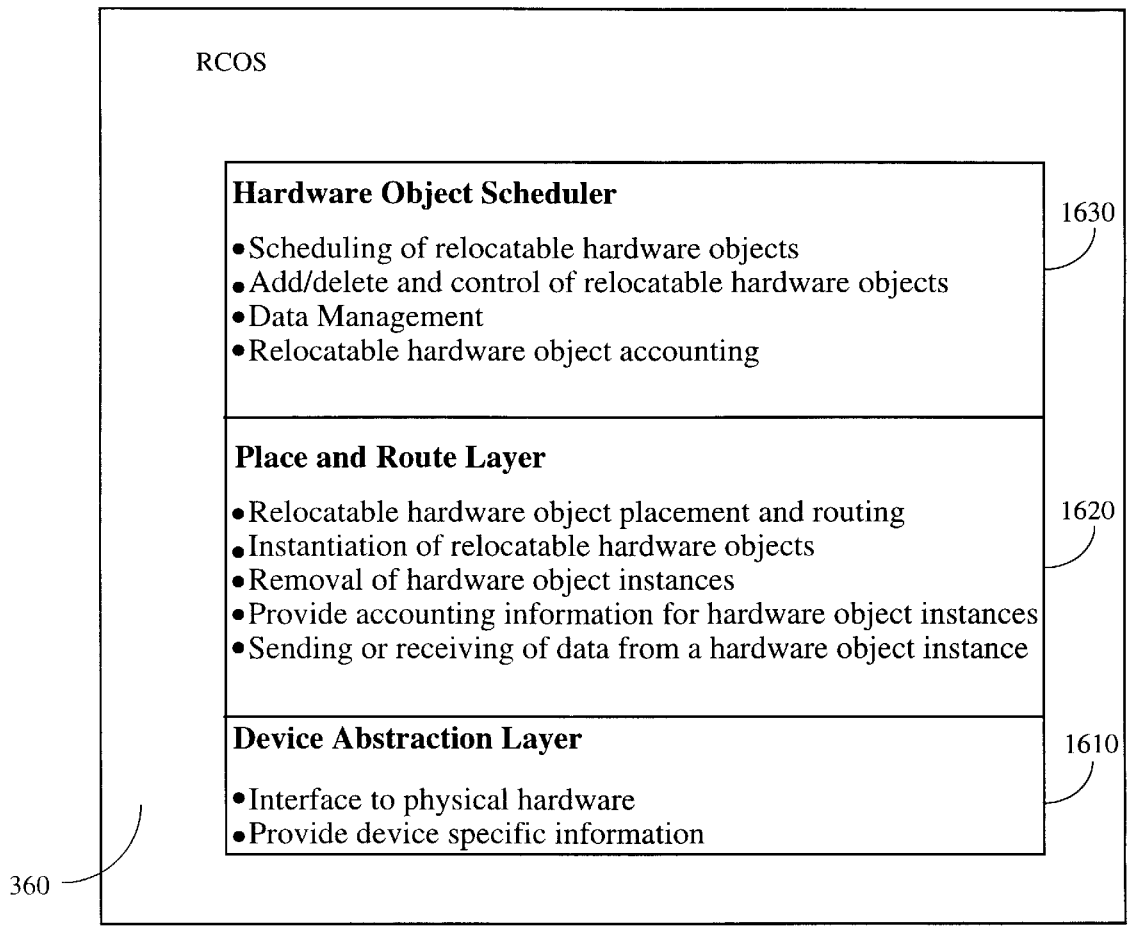
FIG. 18 depicts the structure of the reconfigurable computing operating system (RCOS) of the present invention including the functions that comprise the modular layers of the RCOS.

As shown in FIG. 18, RCOS 360 of the present invention comprises three layers: device abstraction layer 1610 communicates directly with RPUs; place and route layer 1620 tracks free space within the devices, finds locations for relocatable hardware objects and performs any hardware object routing; and hardware object scheduler 1630 provides object scheduling and swapping. This upper layer also provides an API that the Hardware Object class uses to make load/unload/route requests and communicate with running objects.

The device abstraction layer 1610 is the lowest layer of RCOS 360 of the present invention. Its primary function is to isolate the other layers of the RCOS from the particulars of a given RPU. It supplies information to the place and route layer such as: how many RPU resources are available; the dimensions of the RPU resources (number of pages and arrangement of those pages); and the routing resources available to interconnect pages of the standard structure.

Device abstraction layer 1610 is used whenever the next higher layer needs to read or write configuration or state information to or from the RPU. The device abstraction layer 1610 is a hardware-independent interface to the functions of the RPU. It allows the upper layers of RCOS 360 to place, route, control, and exchange data with the hardware object instances. Hardware object instances are the relocatable hardware objects that have been placed on the RPU and thereby implement the functionality specified by their respective relocatable hardware objects. It also can query the RPU for the availability of resources and returns the results to the upper layers.

RPU communication takes place through RPU control interface 394. This interface is specific to a particular RPU, and is abstracted by device abstraction layer 1610. RPU control interface 394 provides functions for configuring the contents and the state of the RPU. RPU control interface 394 also allows data to be flowed to or from resident logic elements. Each hardware object instance 398 running in the RPU will have its input and output signals connected to instances of the interface framework instance 396. It is the responsibility of these interface framework instances to relay data between the sources and sinks external to the RPU (via RPU control interface 394) and hardware object instance 398. These interface framework instances are resident in the RPU or placed individually at runtime depending on the implementation.

Different FPGAs present different interfaces for utilizing their resources. For example, the Xilinx XC6200 used in the current implementation, may present a 32-bit wide memory mapped interface, while another part may have a 1-bit serial interface. The device abstraction layer will transparently map a standard set of higher level functions such as "place bitstream" or "stop clock" into low level operations on the hardware using its particular control interface.

Place and route layer 1620 manages the utilization of the resources on the RPU. Place and route layer 1620 maintains a map of those resources which are available and those resources which are being used. It responds to four types of requests from hardware object scheduler 1630. The first is a request to instantiate a given relocatable hardware object in the RPU as a hardware object instance. The second is a request to delete a hardware object instance from the RPU. The third is a request to provide accounting information for one or more resident hardware object instances. The fourth is a request to send data to or receive data from a resident hardware object instance.

Place and route layer 1620 responds to a request to place a relocatable hardware object by attempting to find a location in the hardware page structure that will accommodate it. Since the relocatable hardware object is already relationally placed and intra-object routed, this layer has only to deal with course grained placement and routing. Place and route layer 1620 has information concerning the basic structure of all hardware objects—that they have a rectangular shape with an integral number of hardware pages on each side. It decides where best to place the required relocatable hardware object.

The determination of a suitable placement of the hardware object instance takes into account the need to connect the hardware object instance to the appropriate interface framework logic. The interface framework logic may remain resident in the RPU or it may be generated and placed dynamically along with the hardware object instance. In either type of implementation, it is the responsibility of place and route layer 1620 to ensure that the hardware object instance is placed relative to that portion of the interface framework that supports it (the interface framework instance) and that all necessary connections between the interface framework instance and its associated hardware object instance are routed together by using a suitable routing algorithm.

Place and route layer 1620 returns a status indicating whether or not the given relocatable hardware object instance could be placed into the RPU to hardware object scheduler 1630. It is the responsibility of hardware object scheduler 1630 to respond appropriately to place and route layer's 1620 failure to place a relocatable hardware object.

The information returned to hardware object scheduler 1630 in the case of a placement failure includes information as to which resident hardware object instances might be swapped out to make room for the requested instance.

Place and route layer 1620 may also be requested to delete a resident hardware object instance because it is no longer needed. This request will take one of two forms. In the first case, hardware object scheduler 1630 indicates that the hardware object instance is to be swapped out temporarily with the intention that it may be swapped back into the RPU at some later time. In the second case, hardware object scheduler 1630 indicates that the hardware object instance is to be permanently deleted. In either case, this layer has to update its resource utilization map to indicate that the resources that are occupied by the designated hardware object instance are now available for use in placing other hardware object instances. However, in the case of a swap, place and route layer 1620 must first save the internal state of the hardware object instance that will be swapped out so that the hardware object instance can be restored if the hardware object instance is later swapped back into the RPU.

Place and route layer 1620 also maintains accounting information for each hardware object instance which it can report to hardware object scheduler 1630 when requested. This information includes a description of the RPU resources currently utilized by the hardware object instance as well as statistics concerning the length of time that it has executed, such as the total amount of time the instance has been resident in the part and the amount of time it has been resident since last being swapped out.

Data movement to or from the hardware object instance via its interface framework instance must also be coordinated by place and route layer 1620, since it knows the relative location at which the hardware object instance resides in the RPU.

As an optimization, place and route layer 1620 also maintains a hardware object instance cache. When the bitstream comprising an instance of a relocatable hardware object is created, place and route layer 1620 saves that information in the cache. If the corresponding relocatable hardware object is swapped out and subsequently placed again at the same location in the RPU, place and route layer 1620 will reuse the corresponding bitstream, if possible, rather than recomputing it.

Hardware object scheduler 1630 is the highest layer of the RCOS of the present invention and provides the interface to the Hardware Object class and its descendants. Hence hardware object scheduler 1630 is responsible for providing an underlying implementation of the RCOS API. Hardware object scheduler 1630 translates high-level requests made through this API into lower-level requests to place and route layer 1620, which responds as outlined above.

Through the RCOS API, hardware object scheduler 1630 provides a number of functions related to the management of relocatable hardware objects to an RCT application. These functions include hardware object management (the addition, removal, and control of executing hardware objects), hardware object scheduling (the prioritization, queuing, and swapping of hardware objects), data management (the transfer of application data to and from executing hardware object instances), and hardware object accounting (reporting statistics).

Hardware object management begins with a request from an RCT application to add a new hardware object instance. The request is accompanied by a relocatable hardware object, which is added to hardware object scheduler's 1630 queue of active hardware objects. Hardware object scheduler 1630 asks place and route layer 1620 to attempt placement of the hardware object; if unsuccessful, hardware object scheduler 1630 must make a decision based on the relative priorities and states of all hardware objects whether to defer execution of the new hardware object or to swap out enough currently resident hardware object instances to accommodate the new hardware object. This decision is made by the scheduling function of hardware object scheduler 1630, as described below.

After addition, the RCT application makes requests to control the disposition of its hardware object instances. These include requests to suspend, resume, or remove the hardware object instance. In the case of a suspend request, hardware object scheduler 1630 instructs place and route layer 1620 to save the state of the hardware object instance and free the resources that the hardware object instance is using for use by other instances. To resume the execution of the hardware object instance, place and route layer 1620 is instructed to place the corresponding relocatable hardware object again. This may involve the use of a previously cached bitstream for that hardware object. When deleting the hardware object, hardware object scheduler 1630 tells place and route layer 1630 to remove the hardware object instance without saving its state and subsequently removes all references to the relocatable hardware object in its queue.

Figure 19:
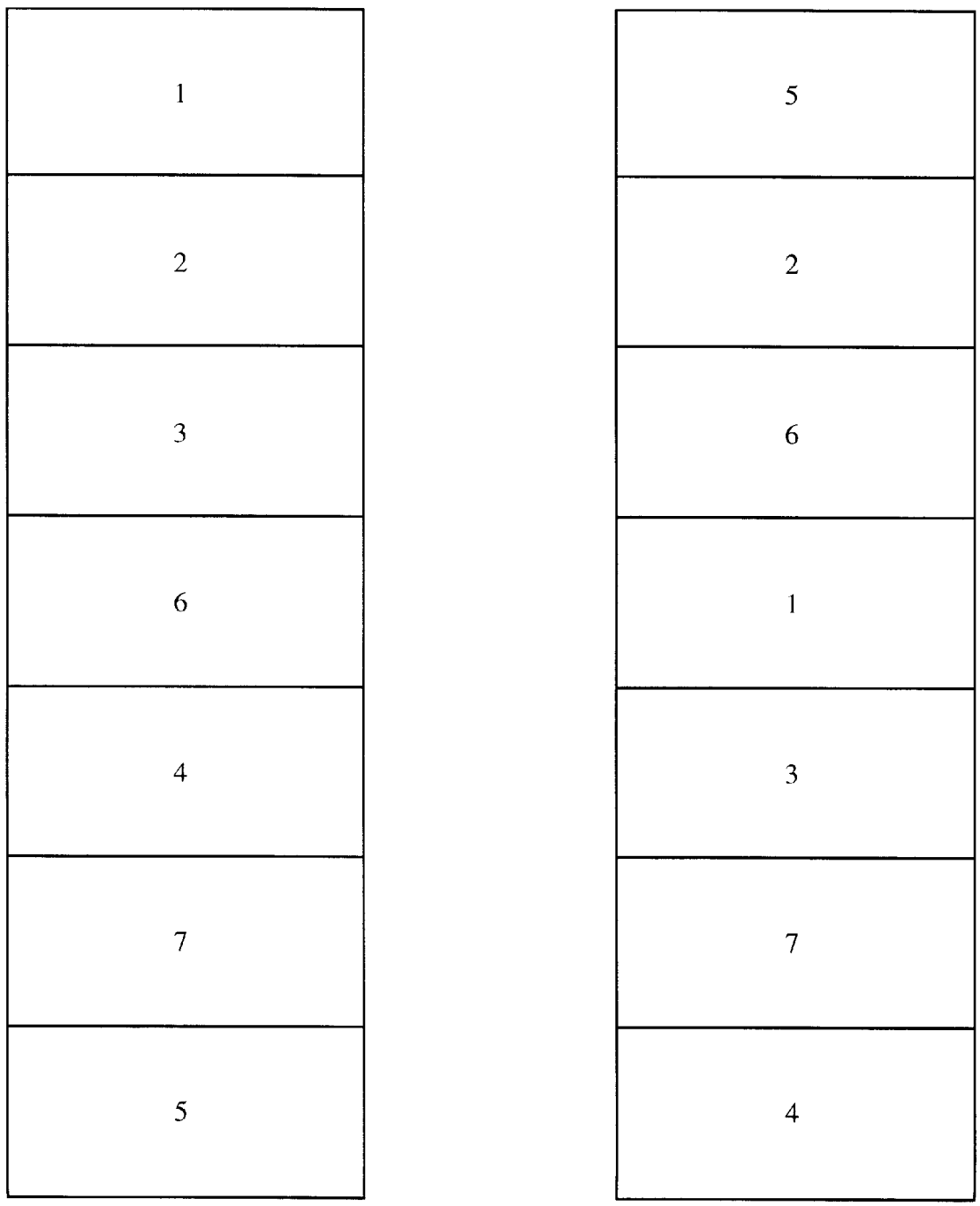
FIG. 19 depicts the concept of object swapping.

One of the primary functions of hardware object scheduler 1630 is the scheduling of relocatable hardware objects in the limited resources of the RPU. Since the RPUs are a shared system resource and since there are potentially multiple threads of execution and multiple users all requesting access to those resources simultaneously, hardware object scheduler 1630 must accept those requests and ensure that they are all serviced in a timely manner. This may involve swapping hardware object instances into and out of the RPUs to ensure equal access. The swapping of hardware object instances provides for context switching in the event that there is contention for limited RPU resources. While paging or memory management in a standard operating system deals with memory, hardware object swapping in the present invention deals with hardware object instances. Object swapping is the movement of an entire hardware object instance or set of hardware object instances into or out of physical RPU space. FIG. 19 shows that any given program can be loaded anywhere in computer memory and may be loaded at a different place each time it is loaded. Execution in terms of a standard computer system can be time sliced based on priority or a simple round robin scheme, or it can be run to completion, or run to deadlock. This functionality is provided here by a scheduling function within hardware object scheduler 1630.

Whenever hardware object scheduler 1630 performs a management operation, it invokes its scheduling function. The scheduling function is responsible for determining which hardware object instances should be resident and executing in the RPU at any given time. It does this by examining the current relocatable hardware object queue. Along with each active relocatable hardware object in the queue, the scheduler maintains the current state of that object. The state is one of: waiting to be placed; executing; idle (waiting for more input data); or suspended. In addition to the current state, each relocatable hardware object also has associated with it a relative priority, which is part of the instantiation information received from the RCT application. At each invocation, the scheduling function makes a determination of which hardware objects to place and which to swap out based upon the state, priority, and execution statistics of all the relocatable hardware objects in the queue.

The scheduling function is invoked whenever an instantiation operation is executed. However, this invocation may not be enough to prevent starvation of lower priority relocatable hardware objects or those that are added after the RPU is full. To prevent this starvation hardware object scheduler 1630 uses a clock to limit the amount of time that hardware object instances may remain resident when there is contention for resources. At the expiration of each clock period, the scheduling function will be invoked, and hardware object instances that have reached their execution limit may be swapped out to accommodate other waiting hardware objects.

Hardware object scheduler 1630 is also responsible for providing data movement between the application and its hardware object instances. A data movement operation is initiated by a read or write request from the application. If the target hardware object instance is resident, the scheduler will use the facilities of place and route layer 1620 to transfer the data. Otherwise, the request will be queued for execution at a later time when the hardware object instance is placed in the RPU.

Finally, in addition to the accounting information maintained by place and route layer 1620, hardware object scheduler 1630 adds it own accounting information. This includes the current disposition of each hardware object and the amount of time that it has spent in each state. This information is returned to the application upon request.

C. JPEG Encoder Example

Figure 20:
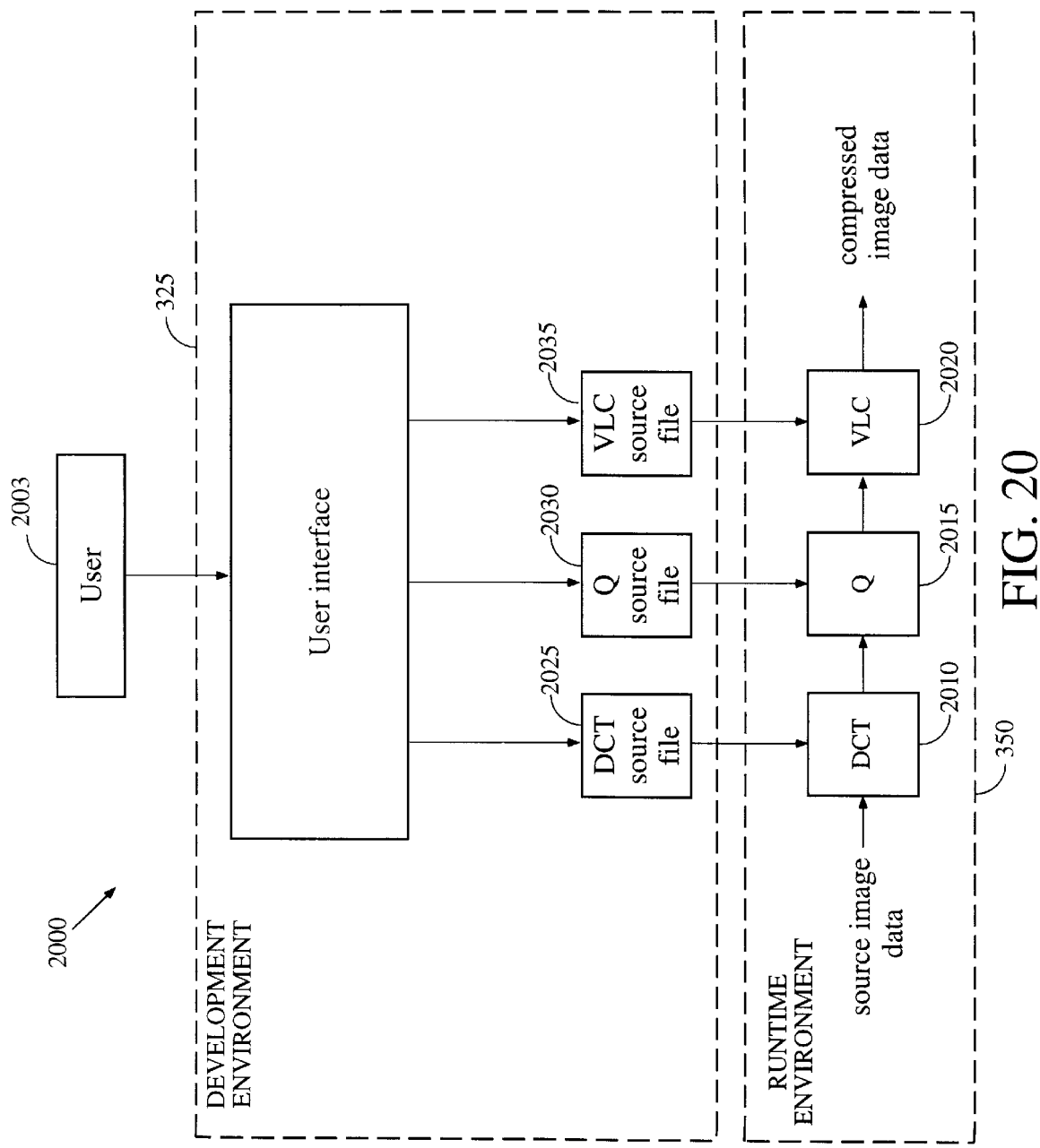
FIG. 20 depicts the development and execution of a JPEG encoder using the development environment and runtime environment of the present invention.

An example application illustrates how the development environment and the runtime environment work together as a system. JPEG encoder design 2000, depicted in FIG. 20, comprises discrete cosine transform (DCT) 2010, a quantizer Q 2015 and a variable length coder VLC 2020.

The first step in the process of using the Reconfigurable Computing Technology (RCT) to implement a JPEG encoder is to design the three blocks necessary to implement this algorithm. Each of the blocks, depicted in FIG. 20 as 2010, 2015, and 2020, comprises a hardware object. A hardware designer 2003 uses the development environment 325 to implement the logic design necessary for each of the required functions (DCT, Q and VLC). The output of the logic design process consists of three relocatable hardware objects, which are stored in the reconfigurable object library. For each of these relocatable hardware objects, a new object-oriented software wrapper class must be developed. This wrapper class will be a subclass of the Hardware Object class and will utilize its functionality to instantiate, control, and exchange date with the hardware object instance. The wrapper class is defined in one or more source files and it is written to be executed in its own thread. FIGS. 21, 22, and 23 illustrate that wrapping respectively for the DCT, Q, and VLC objects of the JPEG encoder example.

As depicted in FIG. 21, the relocatable hardware object for the DCT is referenced in the wrapper class definition in the source file as denoted on line 2. The hardware object is referenced by name as denoted on line 3 of FIG. 21. Constructors are written as denoted on lines 4,5, and 6 of FIG. 21. Input/output assignment mechanisms are created as denoted on lines 7 and 8 of FIG. 21 to allow the object to communicate with other hardware objects or sources and sinks external to the RPU. Further, a software thread is thus developed to associate the hardware object with a software thread. The same process is followed for the Q hardware object depicted in FIG. 22 and the VLC hardware object depicted in FIG. 23.

Notice that there is a constructor in each of the designs that accepts another Hardware Object as input as denoted on line 4 in each FIGS. 21, 22, and 23. This allows a direct connection of the output signals from that hardware object to the input signals of another hardware object. The source arguments describes the source data signals on the input Object. The target argument describes the target data signals on this HardwaRe Object. This information is passed to the RCOS when the relocatable hardware object is instantiated.

Once these hardware objects are created, the JPEG encoder example is developed as shown in FIG. 24. The first step is to instantiate the three hardware objects: DCT, for which no input data is yet provided as denoted on line 2 of FIG. 24; Q, for which the input is to be the output of the DCT object as denoted on line 3 of FIG. 24; and VLC, for which the input is to be the output of the Q object as denoted on line 4 of FIG. 24.

At this point, all of the hardware object images have been queued to the runtime environment and the hardware object scheduler has scheduled them for execution on the reconfigurable processor. The place and route layer has been tasked to find space for the hardware objects. In addition, the hardware object scheduler has been instructed to accept input from the sources external to the RPU for the DCT as denoted on line 2 of FIG. 24, to route the output of the DCT to the input of Q as denoted on line 3 of FIG. 24 and the output of Q to the input of VLC as denoted on line 4 of FIG. 24. The source of the input to DCT has been specified as denoted on line 5 of FIG. 24. The scheduler passes this information to the place and route layer and that layer will handle routing the hardware objects together. If the physical device cannot accommodate all three objects at the same time, then the objects will be scheduled to be instantiated in sequence. In this case, the inputs and output will not be physically routed together on the RPU, but instead logically routed together by temporarily storing the output data from the DCT to Q and the output of Q to VLC.

To actually create the compressed digital image, input is provided to the DCT object and the results appear at the output of the VLC object. In a typical implementation, the call to vlc.output( ) as denoted on line 6 of FIG. 24 will be blocked until the software thread associated with the VLC object receives all of the output data.

The entire process consists of the following five steps.

Step 1 creates the relocatable hardware objects for each of the necessary hardware components, or use a pre-designed library of these elements.

Step 2 wraps each relocatable hardware object into an object oriented language class. The class inherits from and extends the HardwaRe Object class, so it knows how to load and unload locatable hardware objects. Object specific details are provided by the designer.

Step 3 instantiates each of the HardwaRe Object classes at the application level. Establish routing of inputs and outputs, if necessary.

Step 4 provides any input data necessary to the appropriate hardware object(s).

Step 5 gathers output data and results from the appropriate hardware object(s).

Steps 1 and 2 above comprise the development environment of the present invention and steps 3 through 5 comprise the runtime environment. Further, referring back to FIGS. 6 and 7 and assigning hardware object DCT to process A, hardware object Q to process B, and hardware object C to process C, one can see how these hardware objects might be placed on the reconfigurable processor.

Figure 25:
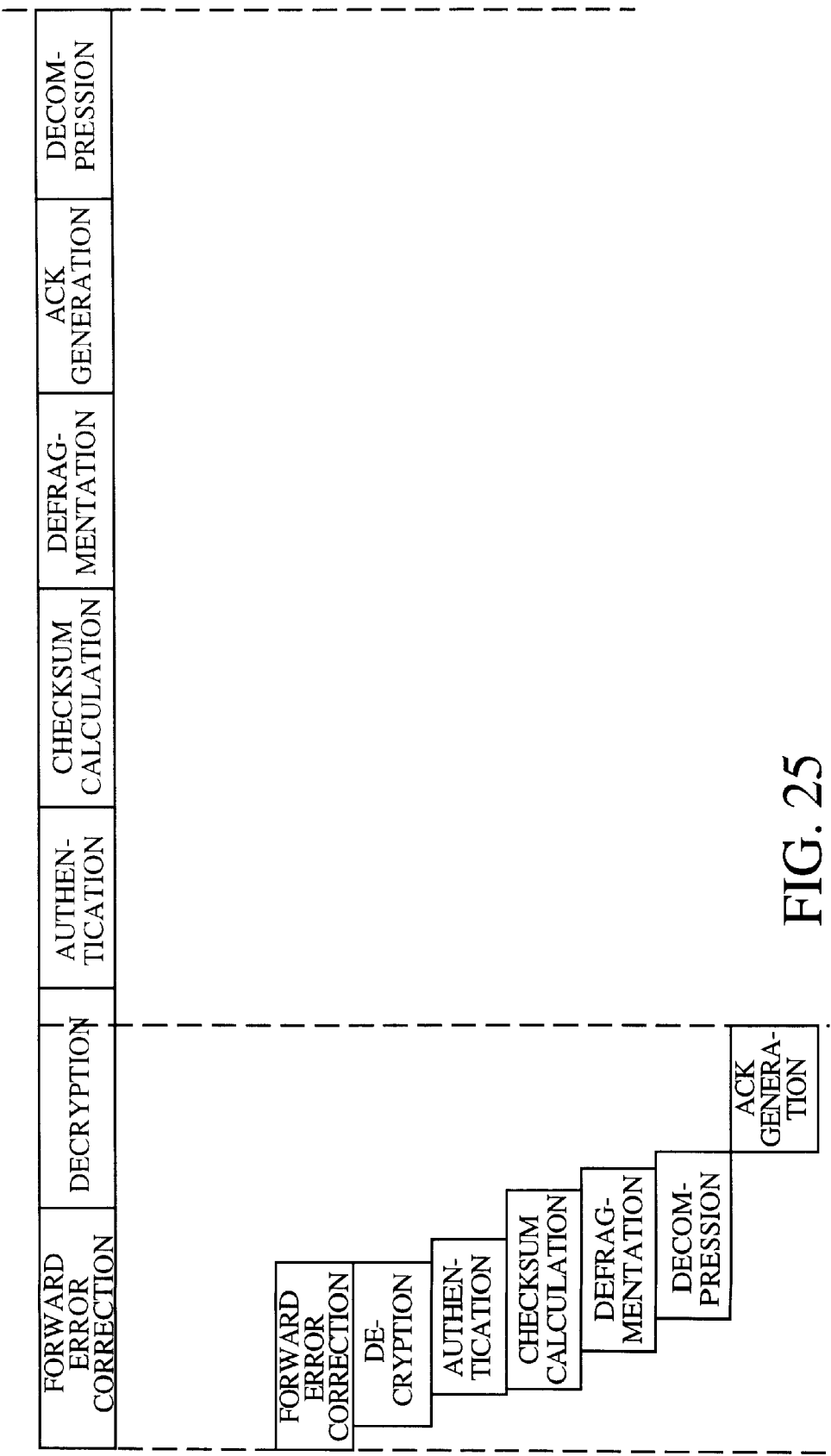
FIG. 25 depicts a timeline which compares the execution time for sequential execution of processes in software to the execution time using an implementation according to the present invention.

FIG. 25 illustrates concurrent execution using reconfigurable resources such as described in the present invention versus sequential execution in a traditional computer system. The process illustrated is that of processing network protocols.

Partial reconfigurability is the concept that while reconfiguring a given section of an RPU, which may be as small as a single gate, other sections of the RPU may remain resident. Also, data registers retain their contents during reconfiguration and the clock signal is not disrupted, so other sections may continue to execute.

Partial reconfigurability enables predefinition of hardware objects, that perform a coherent function and will occupy a section of an RPU. These hardware objects can be dynamically loaded into the RPU and connected to other hardware objects. Data is then streamed through the hardware objects to perform one or more computations in parallel. Primary inputs and outputs can come from host memory via the data bus, but even during reconfiguration data can flow in and out through other ports that connect the RPU chip to other resources such as cache memories, other RPUs, and secondary buses.

The fact that the RPUs can be partially programmed in discrete sections and that the state of these sections can be captured at any time means that they are capable of providing execution contexts for multiple processes in a preemptive multitasking operating system.

The preferred embodiment of the present invention is a high-performance PCI-based coprocessor card such as an ACEcard, sold by TSI Telsys, Inc. Further details of such ACEcards may be found in the ACEcard User's Manual, part number 800-00954, which is incorporated herein by reference. An ACEcard includes a powerful embedded processor that can be used to execute the runtime environment quickly.

In order to use a coprocessor card in a PC or UNIX workstation, a PCI slot and a device driver that allows the host operating system to interface to the PCI card must be available. This interface is denominated the ACEdriver in the preferred embodiment. The ACEdriver software module resides in the kernel and provides a low-level interface to one or more ACEcards. The ACEdriver provides functions for loading hardware objects into a specific location in the reconfigurable resource, retrieving the state of individual objects, providing input data, and capturing results. Currently, there are drivers available for the Windows NT and Solaris operating systems.

Once the ACEcard and ACEdriver are installed on the host system, the various memory regions of the ACEcard will appear as special files in the file system of the host processor. This makes it possible to write application software that opens one of the files and then reads from and writes to the memory on the ACEcard. This includes Xilinx RPUs which can be accessed just as easily. The state of any cell or flip-flop within either RPU can be read or modified directly by any application software running on the host workstation. In addition, the ACEdriver includes a set of input/output control (ioctl) commands for common application requests. These include resetting the entire card, resetting one or both of the RPUs and changing the local bus clock speed.

Figure 26:
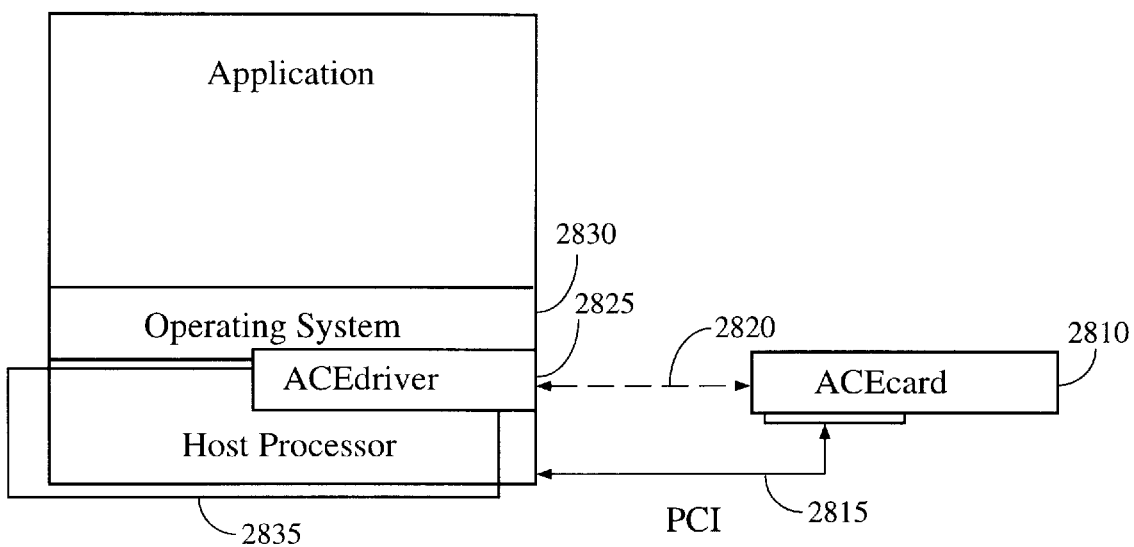
FIG. 26 depicts the interface between the ACEcard and the host processor.

FIG. 26 shows a block diagram of the interface between the ACEcard and host processor 2835. Host processor 2835 includes a traditional microprocessor (Pentium, UltraSPARC, etc) running a mainstream multi-user operating system; either Windows NT or Solaris. The ACEcard 2810 is physically connected to host processor 2835 via processor's local PCI bus 2815. There is a logical interface 2820 between ACEcard 2810 and ACEdriver 2825.

Figure 27:
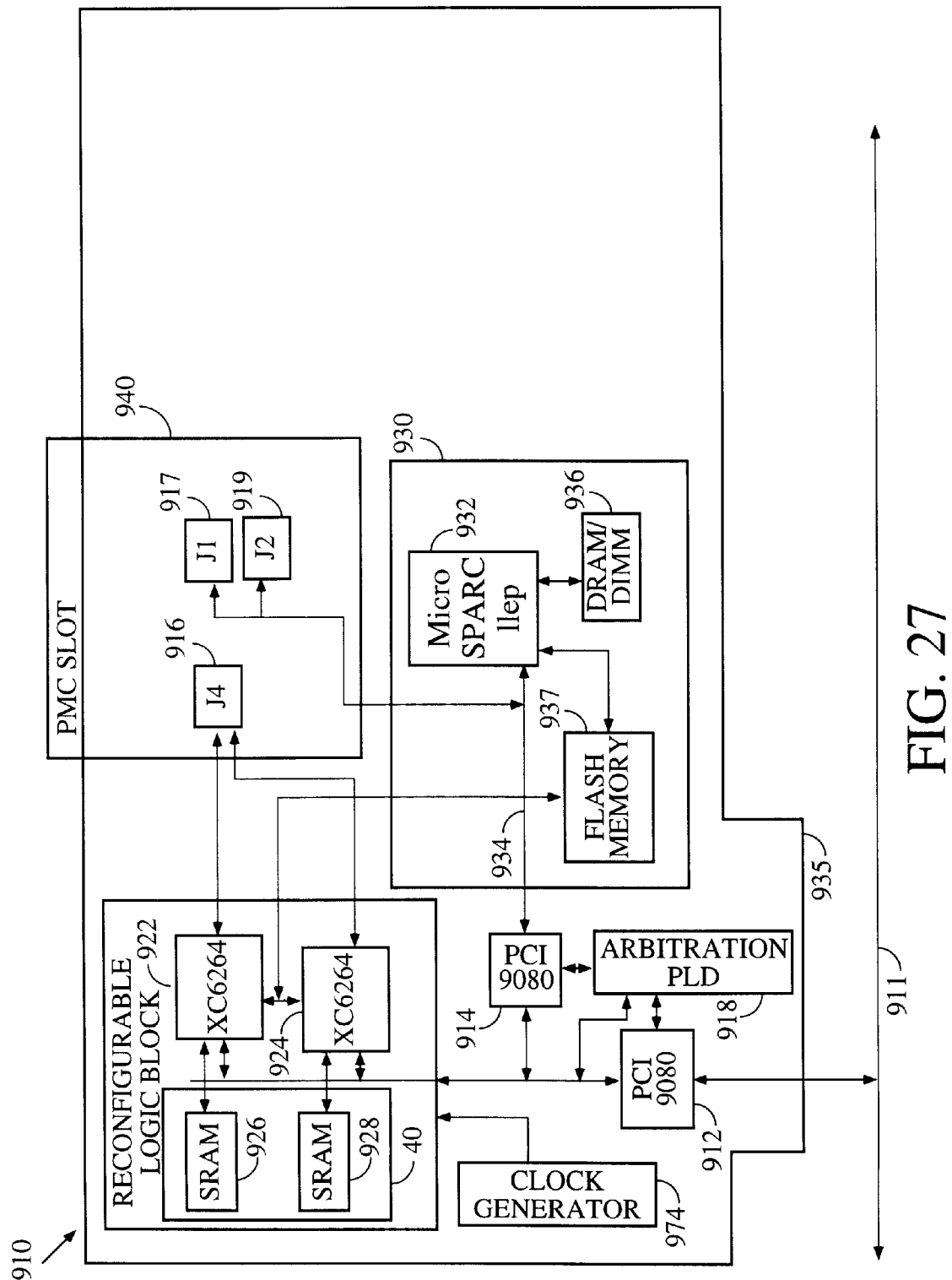
FIG. 27 depicts the physical architecture of the ACEcard.

The architecture of the ACEcard is shown in FIG. 27. Embedded processor 932 on ACEcard 910 is a 100 MHz microSPARC IIep from Sun Microelectronics. It is based on the SPARC architecture specification version 8 and includes a floating point unit, a memory management unit, 16 Kbyte instruction cache, 8 Kbyte data cache, DRAM controller, and a 33 MHz PCI interface. In addition, ACEcard 910 includes up to 64 Mbytes of DRAM 936 and 1 Mbyte of flash memory 937. Embedded processor 932 is equivalent in processing power to a SPARC5 workstation. ACEcard 910 also contains two Xilinx XC6264 RPU FPGAs 922 and 924 which provide high-speed runtime reconfiguration, on-the-fly and partial reconfiguration, a FastMAP processor interface that allows reading and writing of the internal state of the part just like SRAM 926 and 928 and up to 32,768 registers. In addition, there are four high-performance DMA channels and an expansion slot for a PCI Mezzanine Card (PMC) 940.

All of the data paths and bus widths (except flash memory) are 32 bits wide. In addition, both of the card's local busses can be run at the full 33 MHz of the host workstation's PCI bus. This provides full bandwidth performance of up to 1.2 Gbps between the host and the ACEcard. This is very important for providing improved system level performance because improved computational speed is ineffective without corresponding improvements in I/O performance.

In addition to the RPUs and microprocessor, the present invention includes 1 Mbyte of SRAM 926 and 928 which communicate directly with the RPUs. This memory operates at 33 MHz with zero wait states and is arranged as two banks of 128 k×32 bits each. The design of ACEcard 910 allows either memory bank to be accessed by either RPU.

ACEcard 910 further comprises a PMC interface. This interface conforms to IEEE P1386.1, the standard that supports the same electrical interface as the PCI busses 911 and 934. PMC slot 940 is provided on ACEcard 910 to allow for 1/0 interface flexibility. Commercial third-party PMC cards are currently available for various network and peripheral interfaces such as Ethernet, A, FDDI, and SCSI, as well as specialized interfaces such as TTL, ECL, and RS-422. As part of the PMC interface, a custom 42-bit data path connects directly to the RPUs. This hardware interface includes 42 bits of reconfigurable input/output signals as well as a serial clock and data interface.

The above is a brief description of ACEcard 910 which is described in detail in co-pending application Ser. No. 08,955,216, entitled APPARATUS AND METHOD FOR CONCURRENTLY PROCESSING NETWORK PROTOCOLS, filed Dec. 19, 1997, assigned to the assignee (TSI TelSys Inc.) of the present invention, and incorporated herein by reference.

The preferred embodiment of the present invention, as depicted in FIG. 27, comprises embedded processor 932, which is a traditional processor or microprocessor, and two adaptive (reconfigurable) processors 922 and 924. FIG. 4 depicts the system of the present invention including both the development environment and the runtime environment. Also depicted in FIG. 4 is a generalized embodiment of the invention showing a single reconfigurable processor 362. While the preferred embodiment is as described, there is no reason why an alternate embodiment could not be a single reconfigurable processor or even a plurality of reconfigurable processors. Either of these embodiments may or may not have an embedded processor or a plurality of embedded processors. Additionally, the RCOS may run on an embedded processor, a reconfigurable processor, a plurality of processors of either type, or partially on both types of processors or a plurality thereof.

While as discussed herein, the functionality of the hardware objects has typically encompassed application functionalities, there is no reason why an alternate embodiment could not include hardware objects that encompass operating system functionalities and hardware functionalities. That is, operating system functionalities may include functions typically performed by an operating system such as scheduling, and hardware functionalities may include functions typically performed in hardware such as floating point processing.

The invention disclosed herein has been described in detail with particular reference to the preferred embodiment thereof. However, it will be understood that variations and modifications can be effected within the spirit and scope of the invention as described hereinabove and as defined in the appended claims.

We claim:

1. A method of programming a field programmable gate array (FPGA), comprising the steps of:

providing a development environment which includes a hardware object generator, a text editor, a compiler, and a plurality of libraries;

defining a plurality of functional hardware units, each functional hardware unit defining a function that cannot be decomposed and including one or more logic elements;

storing said plurality of functional hardware units in a first one of said plurality of libraries;

generating a plurality of hardware objects with said hardware object generator, each said hardware object including one or more functional hardware units;

storing said plurality of hardware objects in said first library;

selecting one or more hardware objects with said text editor to define a unique function;

storing a plurality of said selected hardware objects or a plurality of references to said plurality of said selected hardware objects in a second one of said plurality of libraries, thereby creating a plurality of unique functions;

selecting one or more of said unique functions with said compiler to create a unique wrapper object module;

storing said wrapper object module in a third one of said plurality of libraries;

providing a runtime environment which includes a computing system and an interface between said computing system and the FPGA;

creating application software operable on said computing system wherein said application software comprises a selected set of hardware objects and said wrapper object modules; and creating a plurality of hardware object instances, each of which is derived from a hardware object and is located at a physical location on the FPGA and each said hardware object instance being controlled by a respective wrapper object module.

2. The method according to claim 1, wherein said first selecting step further comprises the step of generating a software wrapper for each said selected hardware object to reference the hardware object, to provide a run access method, and to provide a mechanism to assign inputs and outputs.

3. The method according to claim 1, wherein said third storing step further comprises the steps of:

storing a plurality of references to said plurality of said selected hardware objects;

storing said plurality of unique functions in one of a plurality of files that comprise said second one of said plurality of libraries; and retrieving said plurality of unique functions from one of a plurality of files that comprise said second one of said plurality of libraries.

4. The method according to claim 1, wherein said second selecting step further comprises the steps of:

compiling said unique functions stored in said plurality of files comprising said second one of said plurality of libraries; and linking said unique functions stored in said plurality of files comprising said second one of said plurality of libraries with functions provided from additional said plurality of libraries.

5. The method according to claim 1, wherein said second selecting step further comprises the steps of:

creating a plurality of said unique wrapper object modules; and storing a plurality of said wrapper object modules.

6. The method according to claim 1, wherein said second providing step further comprises a computing system comprised of a host processor and a reconfigurable processing unit.

7. The method according to claim 6, wherein said reconfigurable processing unit is comprised of a plurality of embedded processors and a plurality of FPGAs.

8. The method according to claim 7, wherein said operating system comprises an operating system that is adapted to run on said host processor and a reconfigurable operating system that is capable of running in said reconfigurable processing unit.

9. The method according to claim 7, wherein said operating system comprises an operating system that is adapted to run on said host processor and a reconfigurable operating system that is capable of running in said embedded processor.

10. The method according to claim 7, wherein said operating system comprises an operating system that is adapted to run on said host processor and a reconfigurable operating system that is capable of running in said host processor.

11. A method of operating a computer system comprising the steps of:

defining a plurality of hardware objects;

locating said hardware objects within the computing system to provide a set of functions;

executing said plurality of hardware objects within the computing system; and swapping said plurality of hardware objects within the computing system to provide another set of functions.

12. The method according to claim 11, wherein said hardware objects are relocatable within said computing system.

13. The method according to claim 12, wherein said hardware objects are dynamically relocatable.

14. The method according to claim 11, wherein said defining step further comprises the steps of:

creating a plurality of functional hardware units, each functional hardware unit defining a function that cannot be decomposed and including one or more logic elements;

storing said functional hardware units in a reconfigurable object library; and retrieving said functional hardware units from said reconfigurable object library.

15. The method according to claim 11, wherein said defining step further comprises the steps of:

creating pre-defined hardware objects;

storing said pre-defined hardware objects in a reconfigurable object library; and retrieving said pre-defined hardware objects from said reconfigurable object library.

16. The method according to claim 11, wherein said defining step further comprises the steps of:

selecting a plurality of functional hardware units and a plurality of pre-defined hardware objects from a reconfigurable object library to perform said function or functions, each functional hardware unit defining a function that cannot be decomposed and including one or more logic elements;

coupling said functional hardware units into one or more said hardware objects; and accessing a reconfigurable object library of said hardware objects, said functional hardware units, and said pre-defined hardware objects.

17. The method according to claim 11, wherein said defining step further comprises the steps of:

determining a standard structure for said hardware objects by specifying a standard size;

creating one or more standard interfaces for said hardware objects by specifying standard access methods; and optimizing said standard size and standard access methods based on the specifications of the reconfigurable processing unit.

18. The method according to claim 17, wherein said optimizing step further comprises optimizing based on anticipated processing tasks to be executed on said reconfigurable processing unit.

19. The method according to claim 17, wherein said defining step further comprises the step of enforcing the use of said standard structures and said standard access methods.

20. The method according to claim 19, wherein said enforcing step further comprises the step of detecting and indicating errors in the use of said standard structures and said standard access methods.

21. The method according to claim 11, wherein said locating step further comprises the step of generating hardware object instances that implement the functionality specified by said hardware objects.

22. The method according to claim 16, wherein said coupling step further comprises combining a plurality of hardware objects into other hardware objects.

23. The method according to claim 11, wherein said swapping step further comprises the step of context switching.

24. The method of claim 11, wherein each hardware object requires a respective set of programmable resources of a programmable gate array, and collectively the hardware objects require more resources than are available on a programmable gate array, the method further comprising:

scheduling on the computer system as a function of programmable resource availability and programmable resource requirements of the hardware objects, times at which the hardware objects are to be loaded into the programmable gate array;

swapping said plurality of hardware objects between the programmable gate array and the computer system responsive to scheduled times for loading the hardware objects.

25. A method of operating a computer system, the method comprising the steps of:

defining a plurality of hardware objects;

locating said hardware objects within the computing system to provide a set of functions;

providing a plurality of wrapper object modules;

executing application software operable on said computing system wherein said application software comprises a selected set of said hardware objects and said wrapper object modules;

executing a plurality of hardware object instances, each of which is derived from a hardware object and is located at a physical location on one or more reconfigurable processing units and each said hardware object instance being controlled by a respective wrapper object module;

controlling the one or more reconfigurable processing units; and swapping said plurality of hardware objects within the computing system to provide another set of functions.

26. The method of claim 25, wherein said controlling step further comprises the steps of:

scheduling one or more hardware objects;

instantiating said hardware objects as hardware object instances;

swapping said hardware object instances;

managing said hardware object instances;

directing the flow of data to and from said hardware object instances; and collecting accounting information on system execution.

27. The method according to claim 26, wherein said scheduling step further comprises the step of accepting requests from multiple programs, multiple users, and multiple threads for said reconfigurable processing units.

28. The method according to claim 27, wherein said scheduling step further comprises the steps of:

arbitrating said requests for said reconfigurable processing units; and implementing a resolution of said requests for said reconfigurable processing units.

29. The method according to claim 28, wherein said scheduling step further comprises the steps of:

accepting requests to change priorities for one or more hardware objects; and queuing said requests for said hardware objects.

30. The method according to claim 29, wherein said instantiating step further comprises the step of loading said hardware object instances into said reconfigurable processing units.

31. The method according to claim 26, wherein said swapping step further comprises the step of context switching.

32. The method according to claim 31, wherein said context switching further comprises the steps of:

identifying functions composed of said hardware object instances which can be swapped out of said reconfigurable processing units;

selecting said hardware object instances based on a priority scheme, resource deadlock, or completion of one or more of said functions;

identifying functions composed of said hardware objects which can be swapped into said reconfigurable processing units;

selecting said hardware objects based on a priority scheme;

requesting said scheduling step to swap said hardware object instance out of said reconfigurable processing units;

swapping said hardware object instances out of said reconfigurable processing units;

requesting said scheduling step to swap said hardware object instances into said reconfigurable processing units; and swapping said hardware object instances into said reconfigurable processing units.

33. The method according to claim 32, wherein said first swapping step further comprises the step of preserving the internal state of said hardware object instances if said hardware object instances were swapped out based on priority or resource deadlock.

34. The method according to claim 33, wherein said context switching step further comprises the steps of:

swapping a function into said reconfigurable processing units that had been previously swapped out of said reconfigurable processing units; and commencing execution of said function at the point it was previously halted.

35. The method according to claim 26, wherein said directing step further comprises the steps of:

controlling one of said hardware object instances via its interface framework;

sending data to said hardware object instance via its interface framework; and receiving data from said hardware object instance via its interface framework instance.

36. The method according to claim 26, wherein said collecting step comprises the steps of:

assembling said system execution information;

preserving said system execution information; and reporting said system execution information.

37. A method of programming one or more intercoupled field programmable gate arrays (FPGAs) with a computer system coupled to the FPGAs, each FPGA comprising a plurality of programmable resources, comprising the steps of:

instantiating a plurality of hardware objects on the computer system, each hardware object requiring a respective set of programmable resources, and collectively, the hardware objects requiring more resources than are available on the one or more FPGAs;

scheduling on the computer system, as a function of programmable resource availability and programmable resource requirements of the hardware objects, times at which the hardware objects are to be loaded into the one or more FPGAs; and loading the hardware objects into the one or more FPGAs at the scheduled times.

38. The method of claim 37, further comprising:

selecting a first set of one or more hardware objects to swap out of the one or more FPGAs, the first set of hardware objects presently loaded in a set of programmable resources of one or more FPGAs;

selecting a second hardware object instantiated on the computer system to swap in to the one or more FPGAs;

unloading the first hardware object from the one or more FGPAs; and loading the second hardware object into set of programmable resources of the one or more FPGAs.

39. The method of claim 38, further comprising saving state data associated with the first set of one or more hardware objects prior to loading the second hardware object, whereby the state data is restorable to the one or more FPGAs when the first set of one or more hardware objects are reloaded.

40. The method of claim 38, further comprising:

maintaining in memory of the computer system a cache for temporary storage of selected ones of the hardware objects; and storing the first hardware object in the cache upon unloading the first hardware object from the one or more FPGAS.

41. The method of claim 40, further comprising saving state data associated with the first set of one or more hardware objects prior to loading the second hardware object, whereby the state data is restorable to the one or more FPGAs when the first set of one or more hardware objects are reloaded.

42. The method of claim 38, further comprising:

dividing the programmable resources of the one or more FPGAs into a plurality of logical hardware pages, each page including a set of programmable resources; and selecting the first set of one or more hardware objects to swap out of the one or more FPGAs as a function of a number of logical hardware pages required by the second hardware object and the number of logical hardware pages used by the first set of one or more hardware objects.

43. The method of claim 42, further comprising dividing the programmable resources of the one or more FPGAs into a plurality of logical hardware pages of one or more sizes, each size having a selected number of programmable logic elements.

44. The method of claim 37, wherein the scheduling step schedules the hardware objects as a function of respective time periods that the hardware objects have executed on the one or more FPGAs.

45. A system for operating a computer system comprising:

means for defining a plurality of hardware objects;

means for locating said hardware objects within the computing system to provide a set of functions;

means for executing said plurality of hardware objects within the computing system; and means for swapping said plurality of objects within the computing system to provide another set of functions.

46. An apparatus for programming one or more inter-coupled field programmable gate arrays (FPGAs) with a computer system coupled to the FPGAS, each FPGA comprising a plurality of programmable resources, comprising:

means for instantiating a plurality of hardware objects on the computer system, each hardware object requiring a respective set of programmable resources, and collectively the hardware objects requiring more resources than are available on the one or more FPGAs;

means for scheduling on the computer system, as a function of programmable resource availability and programmable resource requirements of the hardware objects, times at which the hardware objects are to be loaded into the one or more FPGAs; and means for loading the hardware objects into the one or more FPGAs at the scheduled times.

47. A system for programming a field programmable gate array coupled to a computer system, the field programmable gate array having a plurality of programmable resources, the system for programming comprising:

a development subsystem including means for generating a plurality of executable hardware objects, each hardware object requiring a subset of the programmable resources;

a runtime subsystem adapted to receive and execute said plurality of hardware objects, the execution of said plurality of hardware objects resulting in a plurality of hardware object instances;

means for scheduling as a function of programmable resource availability and programmable resource requirements of the hardware object instances, times at which the hardware objects instances are to be loaded into the programmable crate array; and means for swapping said plurality of hardware object instances between the programmable gate array and the computer system responsive to scheduled times for loading the hardware object instances.

48. The system according to claim 47, wherein said development subsystem further comprises:

means for defining a plurality of functional hardware units, each functional hardware unit defining a function that cannot be decomposed and including one or more logic elements;

means for storing said plurality of functional hardware units in one of said plurality of libraries;

means for retrieving said plurality of functional hardware units from one of said plurality of libraries;

means for storing said plurality of hardware objects in one of said plurality of libraries;

means for retrieving said plurality of hardware objects from one of said plurality of libraries;

means for creating a plurality of unique functions;

means for storing said plurality of unique functions in one of said plurality of libraries;

means for retrieving said plurality of unique functions from one of said plurality of libraries;

means for wrapping each of said plurality of unique functions to create a plurality of wrapper object modules;

means for storing said plurality of wrapper object modules in one of said plurality of libraries; and means for retrieving said plurality of wrapper object modules from one of said plurality of libraries.

49. The system according to claim 47, wherein said runtime subsystem further comprises:

an application runtime environment;

a reconfigurable operating system (RCOS) application portability interface (API);

an RCOS; and an FPGA.

50. The system according to claim 47, wherein said runtime subsystem further comprises:

means for interfacing between said FPGA and host system; and means for creating application software operable on said FPGA wherein said application software comprises a selected set of hardware objects.

51. The system according to claim 49, wherein said RCOS further comprises:

a place and route layer; and a device abstraction layer.

52. The system according to claim 49, wherein said FPGA further comprises:

a control interface;

a plurality of interface framework instances; and a plurality of hardware object instances.

53. The system according to claim 51, wherein said RCOS further comprises:

means for controlling said plurality of hardware object instances on said FPGA;

means for managing data of said plurality of hardware object instances on said FPGA;

means for retrieving accounting information of said plurality of hardware object instances;

means for storing accounting information of said plurality of hardware object instances; and means for reporting accounting information of said plurality of hardware object instances.

54. The system according to claim 51, wherein said place and route layer comprises:

means for placing and routing said plurality of hardware object instances on said FPGA;

means for instantiating said plurality of hardware object instances on said FPGA;

means for removing said plurality of hardware object instances from said FPGA;

means for collecting accounting information of said plurality of hardware object instances;

means for supplying data to said plurality of hardware object instances; and means for receiving data from said plurality of hardware object instances.

55. The system according to claim 51, wherein said device abstraction layer further comprises:

means to interface to said FPGA; and means to collect device specific information.

* * * * *